United States Patent
Natsuaki et al.

(10) Patent No.: US 9,876,125 B2
(45) Date of Patent: Jan. 23, 2018

(54) PHOTOELECTRIC CONVERSION DEVICE AND METHOD FOR MANUFACTURING SAME

(71) Applicant: SHARP KABUSHIKI KAISHA, Osaka-shi, Osaka (JP)

(72) Inventors: Kazuhiro Natsuaki, Osaka (JP); Masayo Uchida, Osaka (JP); Takahiro Takimoto, Osaka (JP); Nobuyoshi Awaya, Osaka (JP); Kazuya Ishihara, Osaka (JP); Takashi Nakano, Osaka (JP); Mitsuru Nakura, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 0 days.

(21) Appl. No.: 14/913,443

(22) PCT Filed: Jul. 11, 2014

(86) PCT No.: PCT/JP2014/068614
§ 371 (c)(1),
(2) Date: Feb. 22, 2016

(87) PCT Pub. No.: WO2015/025637
PCT Pub. Date: Feb. 26, 2015

(65) Prior Publication Data
US 2016/0211388 A1    Jul. 21, 2016

(30) Foreign Application Priority Data

Aug. 23, 2013 (JP) .................................. 2013-173637

(51) Int. Cl.
*H01L 31/0232* (2014.01)
*H01L 27/146* (2006.01)
(Continued)

(52) U.S. Cl.
CPC .... *H01L 31/02162* (2013.01); *H01L 27/1462* (2013.01); *H01L 27/14623* (2013.01);
(Continued)

(58) Field of Classification Search
CPC ......... H01L 27/14621; H01L 27/14625; H01L 27/14623; H01L 27/14629;
(Continued)

(56) References Cited

U.S. PATENT DOCUMENTS 5,973,316 A   10/1999  Ebbesen et al.
6,040,936 A    3/2000  Kim et al.
(Continued)

FOREIGN PATENT DOCUMENTS

JP        11-72607 A      3/1999
JP     2000-111851 A      4/2000
(Continued)

OTHER PUBLICATIONS

"Development of color filters using surface plasmon resonance", NIMS & Toyota Central R&D Labs., Inc., 2010, NanotechJapan Bulletin, vol. 3, No. 2, pp. 3.1-3.6.

*Primary Examiner* — Fernando L Toledo
*Assistant Examiner* — Aaron Gray
(74) *Attorney, Agent, or Firm* — Birch, Stewart, Kolasch & Birch, LLP

(57) ABSTRACT

A photoelectric conversion device capable of preventing anomalous transmission of light of a wavelength that is not supposed to be transmitted and reducing the half-width of a spectral waveform and a method for manufacturing such a photoelectric conversion device are provided. A first photoelectric conversion element is formed on a substrate. A first metal film having a plurality of openings arranged periodically or aperiodically is formed above the first photoelectric conversion element with insulating films interposed ther- (Continued)

ebetween. A second metal film covering a part of the openings in the first metal film is provided.

6 Claims, 15 Drawing Sheets

(51) Int. Cl.
    *H01L 21/00*      (2006.01)
    *H01L 31/0216*    (2014.01)
(52) U.S. Cl.
    CPC .. *H01L 27/14625* (2013.01); *H01L 27/14629* (2013.01); *H01L 27/14645* (2013.01); *H01L 31/02164* (2013.01)
(58) Field of Classification Search
    CPC ......... H01L 31/02162; H01L 31/02164; H01L 31/02165
    USPC ......... 257/432, 435, 294, E31.127, E31.122, 257/E31.121; 438/29, 69, 27
    See application file for complete search history.

(56) References Cited

U.S. PATENT DOCUMENTS

| | | | |
|---|---|---|---|
| 6,285,020 | B1 | 9/2001 | Kim et al. |
| 6,834,027 | B1 | 12/2004 | Sakaguchi et al. |
| 2008/0170143 | A1* | 7/2008 | Yoshida ............ H01L 27/14621 348/294 |
| 2009/0250594 | A1* | 10/2009 | Tanaka .................. G02B 5/201 250/208.1 |
| 2010/0002108 | A1 | 1/2010 | Mabuchi |
| 2010/0078748 | A1 | 4/2010 | Mimuro et al. |
| 2011/0102715 | A1* | 5/2011 | Park ....................... G02B 5/008 349/106 |
| 2011/0149217 | A1* | 6/2011 | Yoon ..................... G02B 5/008 349/106 |
| 2012/0057055 | A1 | 3/2012 | Yokogawa |
| 2013/0057938 | A1 | 3/2013 | Natsumeda et al. |
| 2014/0146207 | A1* | 5/2014 | Yokogawa ............. G02B 5/008 348/281 |

FOREIGN PATENT DOCUMENTS

| | | |
|---|---|---|
| JP | 2001-133618 A | 5/2001 |
| JP | 2001-291265 A | 10/2001 |
| JP | 2003-14622 A | 1/2003 |
| JP | 2008-177191 A | 7/2008 |
| JP | 2010-16114 A | 1/2010 |
| JP | 2010-80686 A | 4/2010 |
| JP | 2012-59865 A | 3/2012 |
| WO | WO 2008/075763 A1 | 6/2008 |
| WO | WO 2011/142456 A1 | 11/2011 |
| WO | WO 2011/155529 A1 | 12/2011 |

\* cited by examiner

Fig. 11

SEM PHOTOGRAPH TAKEN AFTER PHOTO DURING MICROEXPOSURE

OPENING SURROUNDED BY OTHER OPENINGS

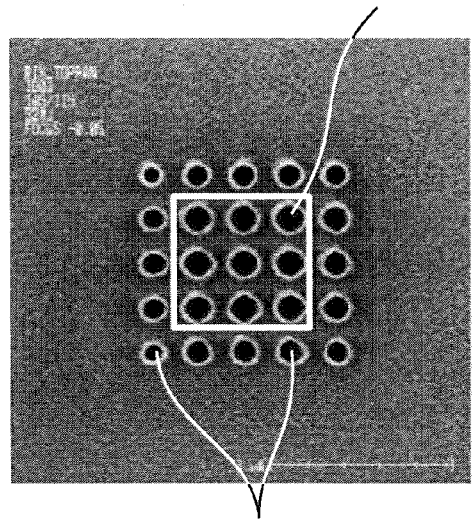

SIZES OF OUTERMOST OPENINGS, ESPECIALLY THOSE IN THE CORNERS, SERVE AS DISTINCTIVE POINTS

Fig. 12

SEM PHOTOGRAPH TAKEN AFTER MICROFABRICATION (ETCHING)

OPENING SURROUNDED BY OTHER OPENINGS

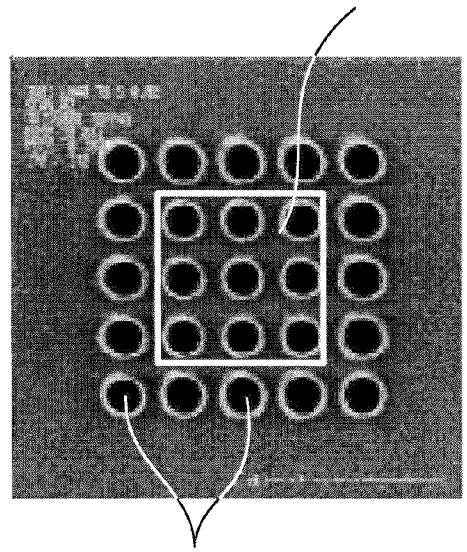

SIZES OF OUTERMOST OPENINGS, ESPECIALLY THOSE IN THE CORNERS, SERVE AS DISTINCTIVE POINTS

INTERFERENCE OF TRANSMITTED LIGHT BETWEEN HOLES IN ORDINARY MASK

INTERFERENCE OF TRANSMITTED LIGHT BETWEEN HOLES IN HALFTONE MASK

PHOTOELECTRIC CONVERSION DEVICE AND METHOD FOR MANUFACTURING SAME

TECHNICAL FIELD

The present invention relates to a photoelectric conversion device such as a color sensor and a method for manufacturing such a photoelectric conversion device.

BACKGROUND ART

The human eye does not much sense changes in color despite variations in color temperature of illumination of a room, and this characteristic is commonly called "chromatic adaptation". For example, moving out of a room with bluish (high in color temperature) fluorescent illumination into a room with yellowish (low in color temperature) incandescent illumination causes a white wall of the latter room to appear yellowish at first. However, passage of a short period of time causes the wall, which have continued appearing yellowish, to start appearing white.

Because of this characteristic, called "color adaptation", of the human visual system, a change in color of illumination of a room causes an image on a television to appear different in color even when the image remains the same in color. In recent years, along with improvement in the image quality of liquid crystal televisions, there has been a growing demand for a function that enables the natural appearance of an image despite a change in color temperature of illumination of a room by changing the hue of the image according to the type of illumination of the room. The incorporation into liquid crystal televisions of a color sensor that detects the color temperature of a room is under way so that, by detecting the temperature of a room, the hue of an image can be automatically controlled to match the color adaptation of the eye. Further, in the case of a liquid crystal screen incorporated into a portable device such as a smartphone or a tablet PC (personal computer), a sensor, such as a color sensor, which automatically detects color temperature is of more importance, as the surrounding illumination changes from moment to moment depending on viewing places.

This color sensor (hereinafter referred to as "RGB sensor") is constituted by separately sensing visible bands of R (red), G (green), and B (blue) light into which ambient light separates.

This RGB sensor uses a plurality of photoelectric conversion elements to sense ambient light, and a device that is to serve as such a photoelectric conversion element is typically constituted by a photodiode. This photodiode per se is incapable of color identification and can thus only detect the intensity of light (amount of light). Therefore, in a case of conversion of an image into an electrical signal, color identification is achieved by covering each photodiode with a color filter, detecting the amounts of R (red), G (green), and B (blue) light, i.e., three primary colors of light, with the respective photodiodes, and thereby obtaining color signals from the photodiodes.

In order to separate ambient light into three primary colors of R (red), G (green), and B (blue) light, a conventional RGB sensor typically employs a method that involves the use of a color filter that transmits or reflects particular wavelengths through the blocking of light by material absorption or the interference of light.

Meanwhile, there has been an increase in the number of two-dimensional solid-state imaging devices, such as digital still cameras and video cameras, which take images of subjects with photoelectric conversion elements composed of two-dimensional solid-state imaging elements. Moreover, color filters that transmit or reflect particular wavelengths through the blocking of light by material absorption of R (red), G (green), and B (blue) or the interference of light are mounted as on-chip filters on the pixels of a currently mainstream solid-state imaging element such as a CCD (charge-coupled device) or a CMOS (complementary metal-oxide semiconductor) imaging element, and the package is provided with an infrared cut filter, as these color filters cannot eliminate infrared light.

However, the conventional RGB sensor requires three types of photomask for the formation of a color filter that separates three primary colors of RGB light, and the requirement of these three types of photomask is a factor in increasing the time and cost of a manufacturing process.

In order to reduce the time and cost, a structure including a metal thin film subjected to nanoscale microfabrication serves as a light-wavelength-selective filter that replaces the aforementioned color filter. A light-wavelength-selective filter of this structure uses an anomalous transmission phenomenon of light by surface plasmon resonance that is excited by incident light.

Such a wavelength-selective filter using surface plasmon resonance is described in detail in PTL 1 (Japanese Unexamined Patent Application Publication No. 11-72607). There are various methods as means for causing such an anomalous transmission phenomenon, an example of which is a method of, as shown in FIG. 8, forming a filter layer 500 by forming a thin metal film approximately 50 to 200 nm thick and patterning, in the metal film 501, an array of holes 502 that are finer than a transmission wavelength. FIG. 9 shows the waveform of a spectrum that is transmitted when light is incident on the filter layer 500. Note, however, that since the surface plasmon effect is produced by the resonance between surface plasmon that is produced at the interface between a metal film and an insulator film or air and evanescent light that is produced by incident light, it is desirable, for efficient production of the surface plasmon effect, that the metal film and the insulator film be of unitary construction (material, uniformity in properties such as refractive indices, uniformity in hole pitches and shapes). For example, Au, Ag, Al, or the like is used as a metal material.

In particular, Al is often employed because it has the following advantages, for example:

(i) Al has a high plasma frequency and thus produces a resonance phenomenon even at a short wavelength.

(ii) Al is a material that is used in an ordinary semiconductor process, and requires no special apparatus or material in terms of process integration.

(iii) Al is an inexpensive material.

(iv) Al is prepared in a simple process, and enables batch formation of filters corresponding to the respective wavelengths.

Note, however, that the formation of a metal film that produces the surface plasmon effect requires microfabrication of openings at levels of 65 nm to 0.13 um under the design rule.

NPL 1 (Focus 26 <Third> Hyômen purazumon kyômei wo riyôshita karâfiruta no kaihatsu [Development of color filters using surface plasmon resonance], NIMS & Toyota Central R&D Labs., Inc.) requires a hole-to-hole pitch of approximately 200 nm for the transmission of ultraviolet light with a wavelength of 300 nm. The formation of an Al film that transmits blue light having a wavelength of approximately 400 nm requires the holes 502 to be placed at pitches of approximately 260 nm and each hole 502 to have a diameter of approximately 80 to 180 nm as shown in FIG. 10. The formation of a metal film filter that transmits light with RGB wavelengths requires the holes 502 to be placed at pitches of approximately 260 nm for blue light transmission as mentioned above.

CITATION LIST

Patent Literature

PTL 1: Japanese Unexamined Patent Application Publication No. 11-72607

Non Patent Literature

NPL 1: Focus 26 <Third> Hyômen purazumon kyômei wo riyôshita karâfiruta no kaihatsu [Development of color filters using surface plasmon resonance], NIMS & Toyota Central R&D Labs., Inc.

SUMMARY OF INVENTION

Technical Problem

Incidentally, such an array of holes is formed on a photoelectric conversion element in the following manner. A photoelectric conversion element is formed by introducing a layer of N-type impurities such as phosphorus onto a P-type silicon substrate by ion implantation or the like. On this photoelectric conversion element, an insulator film is formed from $SiO_2$ or the like. On this insulator film, an electrode is formed from an AlCu material. On this electrode, another $SiO_2$ film is formed. After that, the $SiO_2$ film is flattened by CMP (chemical mechanical polishing) or the like. On this $SiO_2$ film, an Al material is formed approximately 150 nm thick with a spattering apparatus. Furthermore, onto this Al material, a resist or the like is applied. This resist is exposed by an exposure apparatus such as a scanner with a mask patterned with an array of holes and developed. After that, the Al material is etched with etching equipment and finished with patterning.

Note here that the array of holes requires more careful conditioning than ordinary exposure for the holes 502 to be densely formed as shown in FIG. 10. For example, in the presence of a large number of holes adjacent to each other at short distances, such as holes 100 nm or smaller in hole diameter and 200 nm in pitch, an ordinary mask such as that shown in FIG. 13 cannot prevent the interference of light transmitted through each hole and thus undesirably makes it impossible to develop the resist as planned. To address this problem, a halftone mask such as that shown in FIG. 14 or the like is used. However, mutual influence is unavoidable at shorter distances. For this reason, it has been usual to perform conditioning in consideration of such mutual influence.

Then, whereas a hole completely surrounded by other holes is subjected to interference from the surrounding holes, an unsurrounded hole such as one of the outermost holes is only partially subjected to the aforementioned influence and thus differs in hole diameter (This problem is not described in section "Background Art", but was found by the inventors of the present invention.). For example, FIG. 11 shows an example of the shapes of openings formed as a result of exposures performed under such nonuniform conditions. During exposure, an outer hole or (and a hole therearound), which is not surrounded by other holes, is processed to have a smaller diameter, due to the absence of interference from surrounding holes.

After the exposure/development of the resist, the holes are processed by generating plasma in an atmosphere of reactant gas with the etching equipment and etching the metal film. In so doing, variations in etching occur depending on the roughness and fineness of the pattern. This phenomenon is called "microloading effect". A rough part of the pattern tends to be higher in etching rate than a fine part of the pattern. Possible causes of this are an increase in the amount of consumption of contributing radicals and a decrease in a sidewall protective film that is formed by carbon, oxygen, and nitrogen emitted from the resist. As compared with a part of the pattern surrounded by holes, the outermost part, which is not surrounded by holes, is low in etching rate, and in some cases, only the outermost holes (and holes in the vicinity thereof) may be processed to be large as shown in FIG. 12.

After the etching, the resist is removed, and a $SiO_2$ film is deposited by a $SiO_2$ deposition apparatus, whereby a plasmonic filter is constituted.

In a case where such a manufacturing method is employed to form an array of holes under conditions where there is nonuniformity in hole diameters, the resulting filter is nonuniform in transmission properties, and the measurement of spectral sensitivity with a photoelectric conversion element shows worse transmission properties in the case of nonuniform opening indicated by the solid line in FIG. 15 than in the case of uniform opening processing indicated by the dotted line in FIG. 15. For example, the half-width of the waveform of a spectrum that is transmitted becomes greater, and transmission of wavelengths whose transmission are supposed to be reduced occurs. Thus, since the plasmonic filter selectively transmits wavelengths according to the hole pitch and the hole diameter, variations in hole diameter lead to nonuniformity in transmission properties, with the undesirable result that the desired properties cannot be achieved.

It is therefore an object of the present invention to provide a photoelectric conversion device free of variations in hole diameter and capable of preventing anomalous transmission of light of a wavelength that is not supposed to be transmitted and reducing the half-width of a spectral waveform and a method for manufacturing such a photoelectric conversion device.

Solution to Problem

In order to solve these problems, a photoelectric conversion device of the present invention includes:

a first photoelectric element provided on a substrate;

a first metal film for constituting a plasmonic filter region, the first metal film being provided above the first photoelectric conversion element with insulator films interposed therebetween and having a plurality of openings arranged periodically or aperiodically; and a second metal film covering a part of the plurality of openings in the first metal film.

Further, a method of the present invention for manufacturing a photoelectric conversion device includes:

forming a photoelectric conversion element on a substrate;

forming a plurality of wiring layers in sequence above the substrate with insulator films interposed therebetween, respectively, so that the uppermost wiring layer among the plurality of wiring layers also serves as a second metal film; and forming a first metal film (above the first photoelectric conversion element with insulator films interposed therebetween, the first metal film being for constituting a plasmonic filter region and having a plurality of openings arranged periodically or aperiodically, so that a part of the plurality of openings in the first metal film is covered with the second metal film.

Advantageous Effects of Invention

According to the preset invention, a part of the plurality of openings in the first metal film constituting the plasmonic filter region is covered with the second metal film. This makes it possible to block light transmitted through openings that tend to be nonuniform in shapes due to the influence of interfering light from adjacent openings during exposure and the microloading effect during etching. This in turn makes it possible to ensure the desired wavelength selectivity.

BRIEF DESCRIPTION OF DRAWINGS

FIG. 11 is an SEM (scanning electron microscope) photograph taken after photo during microexposure.

FIG. 12 is an SEM photograph taken after microfabrication (etching).

DESCRIPTION OF EMBODIMENTS

Embodiments of the present invention are described below with reference to the drawings.

First Embodiment

Figure 1:
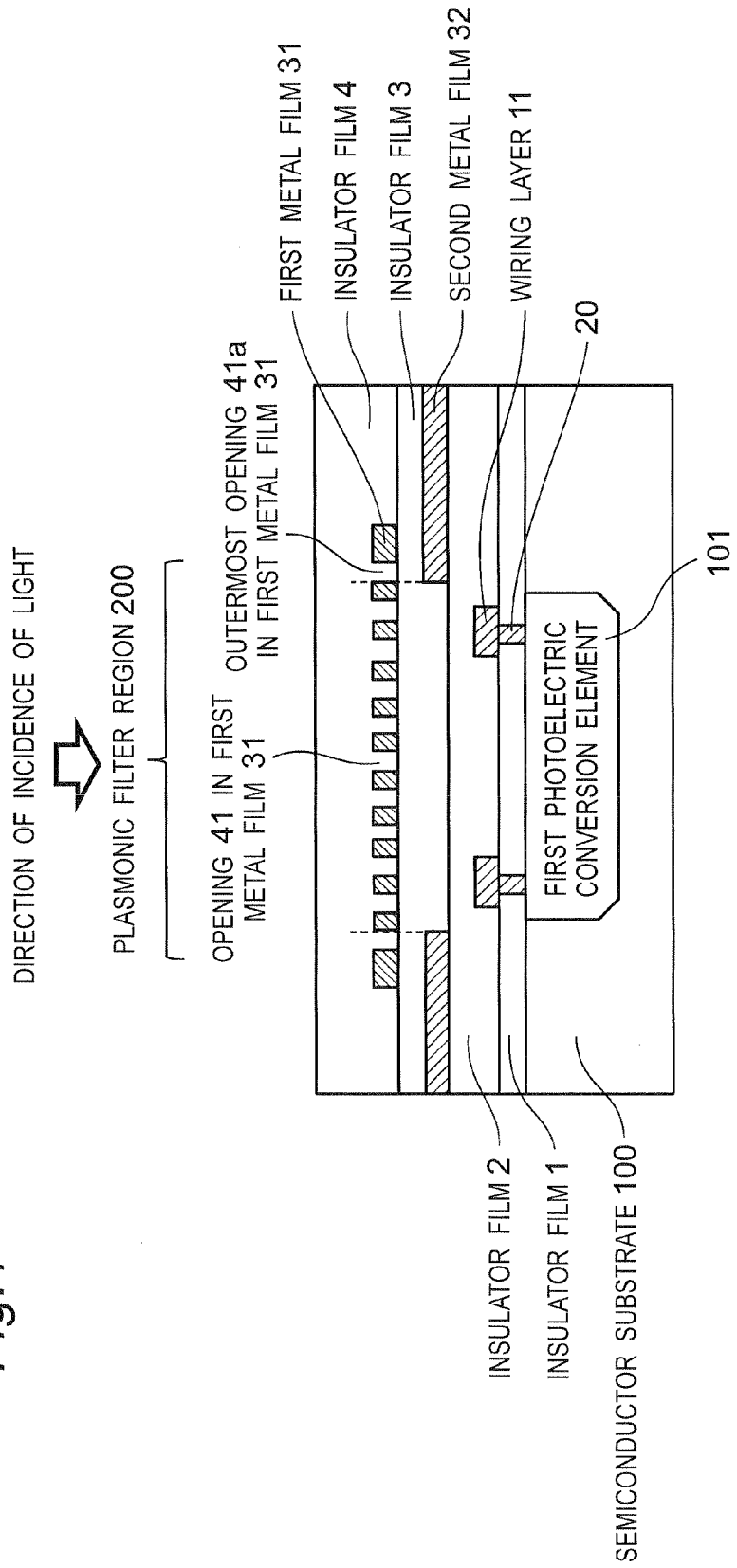
FIG. 1 is a cross-sectional view of a photoelectric conversion device according to a first embodiment of the present invention.

FIG. 1 is a cross-sectional view of a photoelectric conversion device according to a first embodiment of the present invention. In FIG. 1, reference numeral 100 denotes a semiconductor substrate of a first conductivity type (e.g., a P type), which is an example of a substrate. Reference numeral 101 denotes a photoelectric conversion element composed for example of photodiodes or the like provided in correspondence with R, G, and B, respectively, so as to detect the amounts of three primary colors of R, G, and B light, respectively. Reference numerals 1, 2, 3, and 4 denote insulator films composed for example of $SiO_2$ or the like. Reference numeral 11 denotes a wiring layer. Reference numeral 20 denotes a via hole. Reference numeral 200 denotes a plasmonic filter region. Reference numeral 31 denotes a first metal film for constituting the plasmonic filter region 200. Reference numeral 32 denotes a second metal film. Reference numeral 41 denotes a plurality of openings formed in the first metal film 31. Reference numeral 41a denotes the outermost openings among the plurality of openings 41.

The outermost openings 41a among the plurality of openings 41 in the first metal film 31 constituting the plasmonic filter region 200 are covered with the second metal film 32.

In the photoelectric conversion device thus configured, the outermost openings 41a among the plurality of openings 41 in the first metal film 31 constituting the plasmonic filter region 200 are covered with the second metal film 32, which is separate from the first metal film 31. This makes it possible to block light transmitted through the outermost openings 41a, which tend to be nonuniform in shapes due to the influence of interfering light from adjacent openings during exposure and the microloading effect during etching. This in turn makes it possible to form a plasmonic filter with the desired wavelength selectivity ensured.

Therefore, the photoelectric conversion device according to the first embodiment makes it possible to prevent anomalous transmission of light of a wavelength that is not supposed to be transmitted and reduce the half-width of a spectral waveform.

Next, a method for manufacturing a photoelectric conversion device according to the first embodiment is described with reference to FIGS. 2 to 5.

Figure 2:
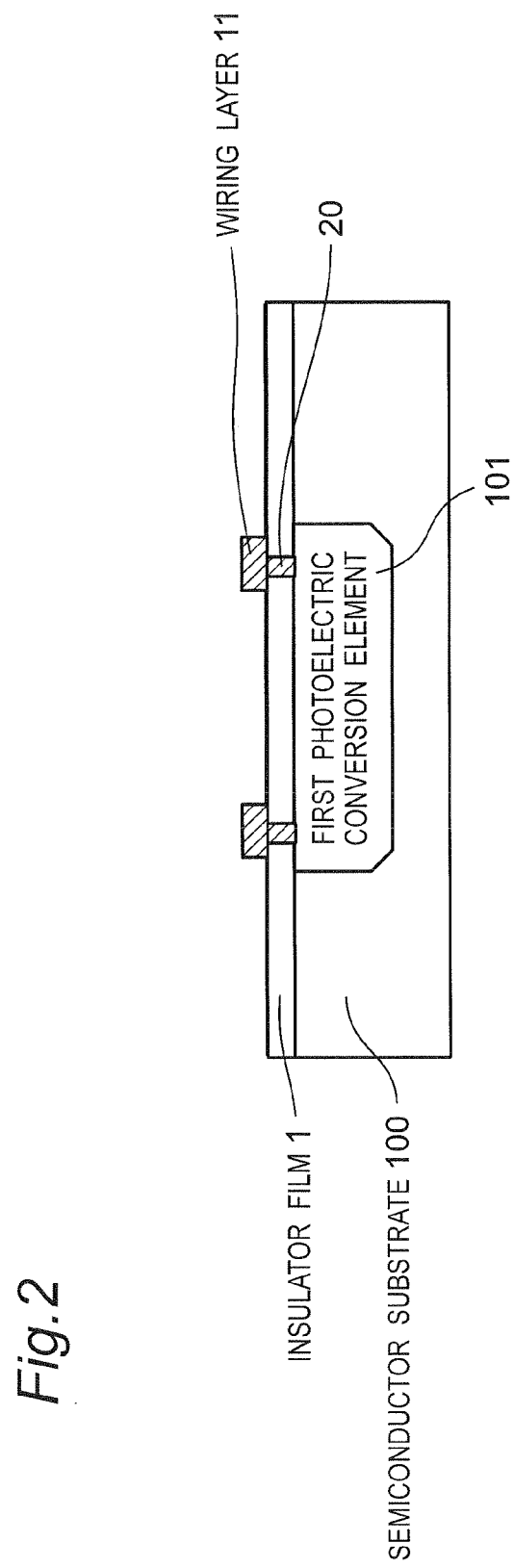
FIG. 2 is a cross-sectional view explaining a manufacturing method according to the first embodiment of the present invention.

As shown in FIG. 2, a photoelectric conversion element 101, such as a photodiode, which converts incident light into an electrical signal is formed by introducing impurities of a second conductivity type (N type) into a predetermined position on a semiconductor substrate 100 of a first conductivity type (P type), which is an example of a substrate, and performing heat treatment. The semiconductor substrate 100 is covered with an insulator film 1 such as a $SiO_2$ film, and on the insulator film 1, a wiring layer 11 is formed. The wiring layer 11 is connected to cathode and anode sides of the first photoelectric conversion element 101 through via holes 20 so that a photoelectric current can be taken out.

Figure 3:
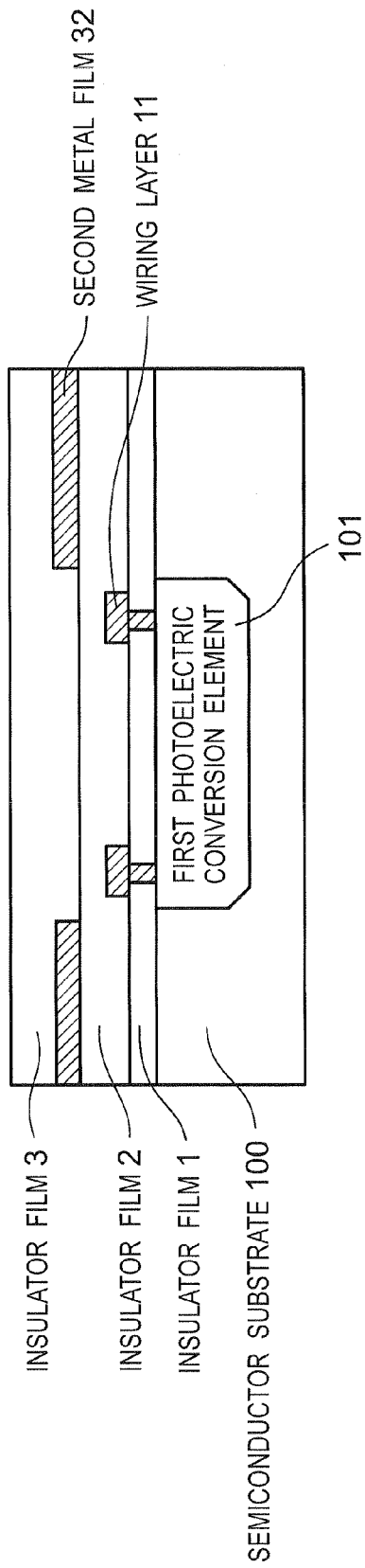
FIG. 3 is a cross-sectional view explaining the manufacturing method according to the first embodiment of the present invention.

Next, as shown in FIG. 3, an insulating layer 2, which is to serve as an interlayer insulator film, is formed from $SiO_2$ or the like on the insulator film 1 and the wiring layer 11. On the insulating layer 2, a second metal film 32 is formed from metal such as Al or AlCu by sputtering or the like. A part of the second metal film 32 in a predetermined position is removed by photolithography with an exposure machine and etching with a dry etcher, and on the remaining part of the second metal film 32 and the insulator film 2, an insulator film 3, which is to serve as an interlayer insulator film, is formed from $SiO_2$ or the like to cover the second metal film 32. After the formation of the insulator film 3, the insulator film 3 is processed by CMP until it becomes completely flat, as the insulator film 3 has a difference in level depending on the presence and absence of the second metal film 32. This surface flattening is important because a first metal film 31 will be applied onto this surface of the insulator film 3 which has been completely flattened by CMP and the first metal film 31 will be subjected to photolithography with a fine pattern of a wavelength-selective filter for transmitting particular types of light e.g., R (red), G (green), and B (blue)).

Figure 4:
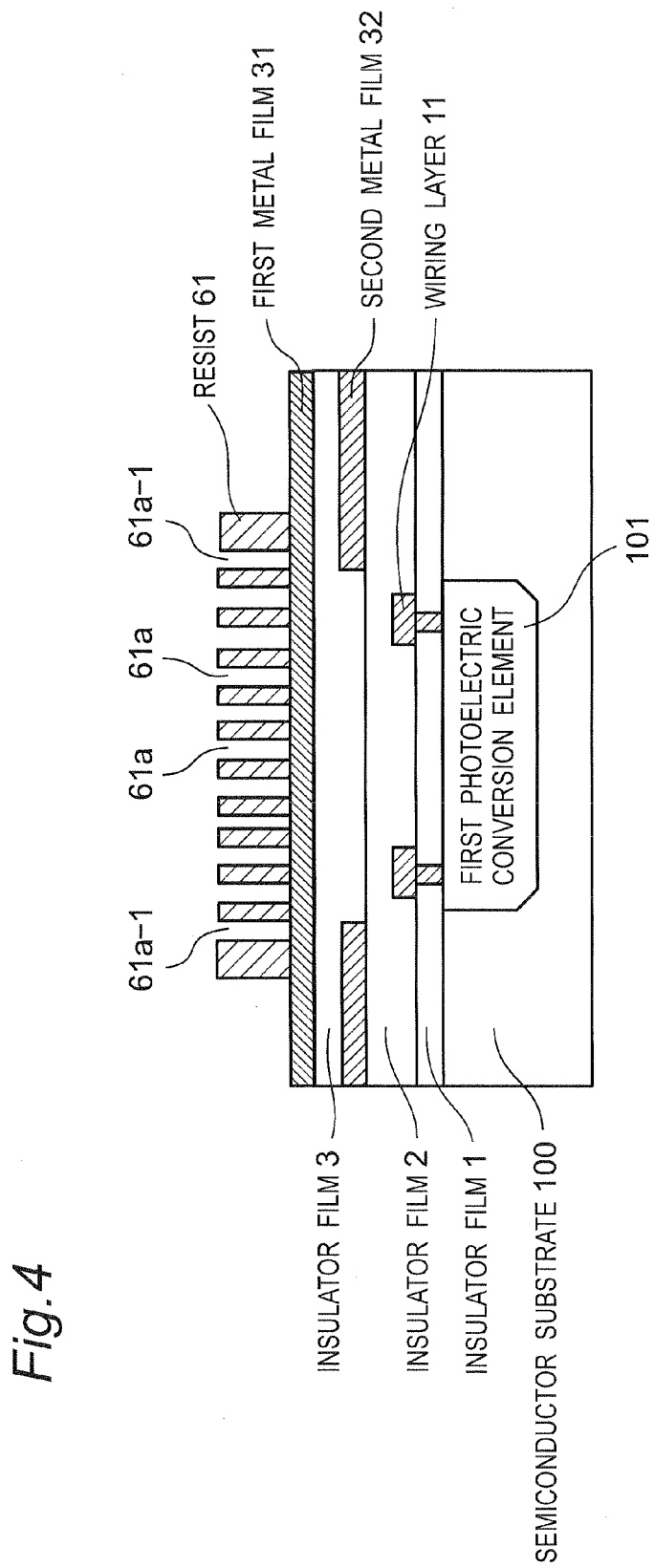
FIG. 4 is a cross-sectional view explaining the manufacturing method according to the first embodiment of the present invention.

Next, as shown in FIG. 4, on the insulator film 3 thus flattened, the first metal film 31, which serves as a filter material, is formed by sputtering to have a thickness of 150 nm. For unity of material, it is most desirable that the metal of which the first metal film 31, which serves as a filter material, is made be Al; however, the metal may be AlCu or AlSi, which are more commonly used in semiconductor manufacturing. Further, it is desirable that the first metal film 31 have a film thickness of approximately 50 to 200 nm. Further, it is necessary that the first metal film 31 have a film thickness that enables blocking of light wavelengths of 300 nm to 1200 nm, as light-blocking metal sections (not illustrated) will be formed from the same first metal film 31.

Figure 5:
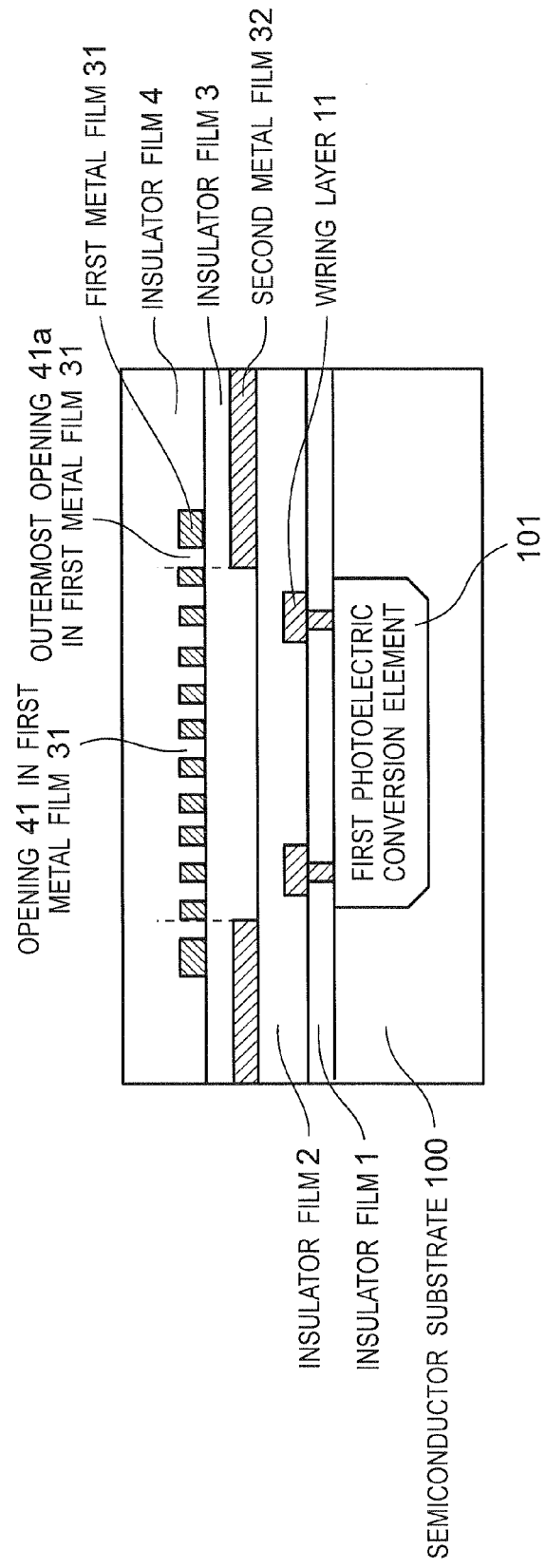
FIG. 5 is a cross-sectional view explaining the manufacturing method according to the first embodiment of the present invention.

As shown in FIG. 4, after the application of the first metal film 31, a photoresist 61 is applied onto the first metal film 31, and a pattern of openings 61a is formed in the photoresist 61 by photolithography. This pattern of openings 61a is formed on a part of the first metal film 31 above a light-receiving opening above the photoelectric conversion element 101, and is also formed so that all of the outermost openings 61a-1 are covered with the second metal film 32. Then, the first metal film 31 is etched with the photoresist 61 as a mask to have a plurality of openings 41 as shown in FIG. 5. The outermost openings 41a among the plurality of openings 41 are covered with the second metal film 32.

Such covering of the outermost openings 41a among the plurality of openings 41 in the first metal film 31 with the second metal film 32 makes it possible to block light transmitted through the outermost openings 41a, which tend be nonuniform in opening shapes due to the influence of interfering light during exposure and the microloading effect during etching. This makes it possible to prevent an increase in the half-width of the transmitted light and anomalous transmission such as transmission of light of a wavelength that is not supposed to be transmitted.

After that, as shown in FIG. 5, an insulator film 4, which is to function as a protective film, is formed from $SiO_2$ on the first metal film 31 and the insulator film 3. In so doing, the insulator film 4 is formed from $SiO_2$ by a high-density plasma CVD (chemical vapor deposition) method, as the plurality of openings (through-holes or depressions) 41 formed in the first metal film 31 in the preceding step need to be filled with the insulator film 4, i.e., $SiO_2$.

Figure 10:
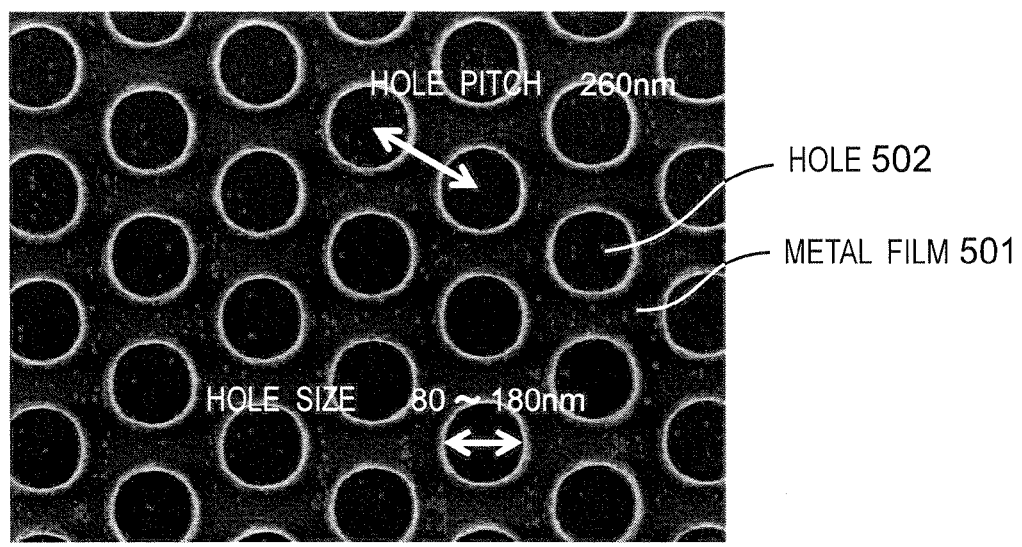
FIG. 10 is a diagram showing an example of an array of holes of a blue light-transmitting filter.
Figure 13:
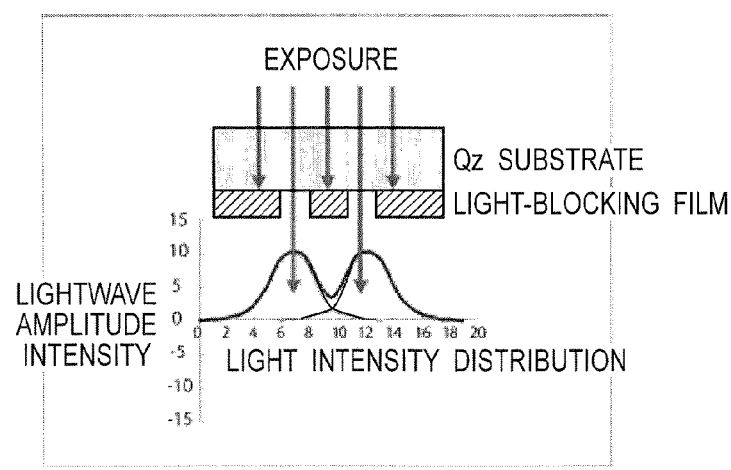
FIG. 13 is a diagram explaining the interference of transmitted light between holes in an ordinary mask.
Figure 14:
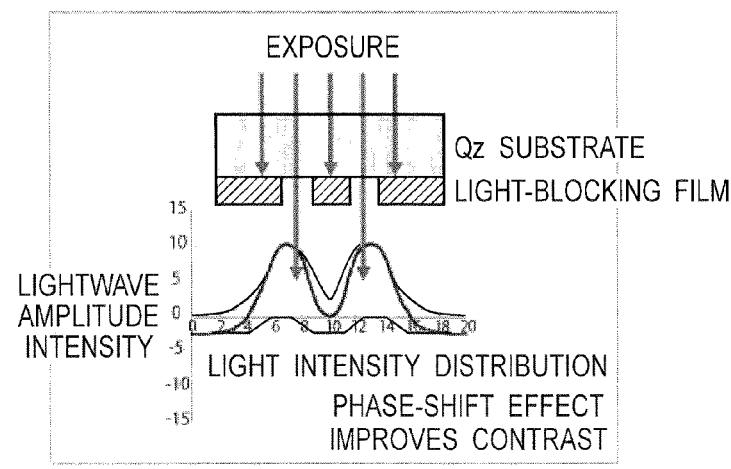
FIG. 14 is a diagram explaining the interference of transmitted light between holes in a halftone mask.
Figure 15:
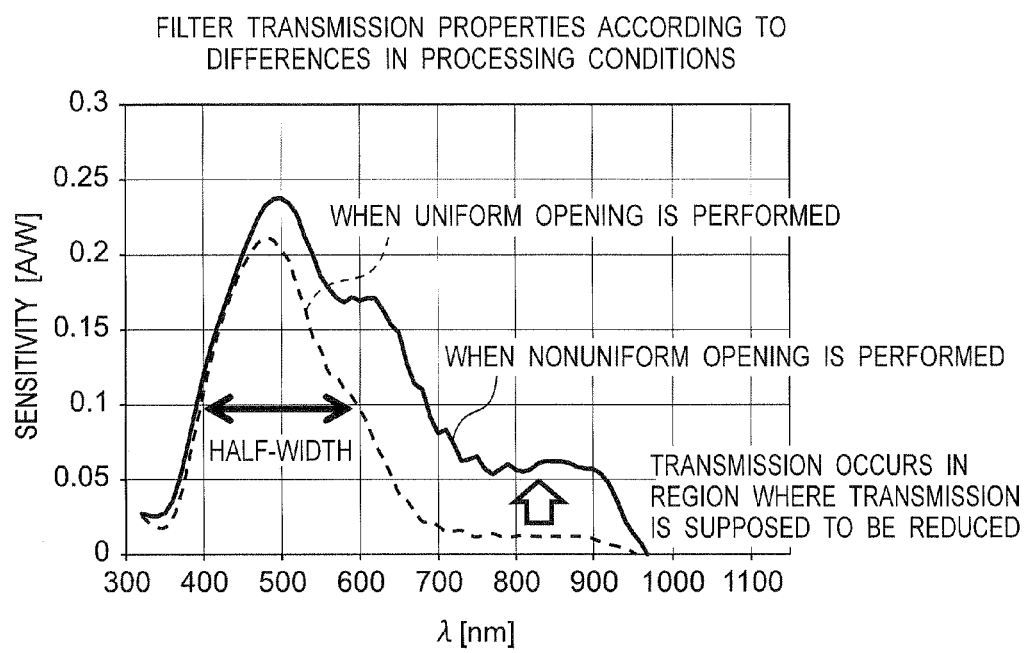
FIG. 15 is a diagram showing filter transmission properties according to differences in processing conditions.

The plurality of openings 41 in the first metal film 31 are arranged in a two-dimensional and periodic pattern. The openings 41 take the form of through-holes or depressions. The openings 41 are in the shape of circles, quadrangles, triangles, or the like. The formation of the plurality of periodic openings 41 in the first metal film 31 above the first photoelectric conversion element 101 allows the first metal film 31 to function as a wavelength-selective filter, because when light is incident on the first metal film 31, the incorporation of a surface plasmon dispersion relation into the openings 41 two-dimensionally and periodically arranged on the first metal film 31 allows surface plasmon to be excited by the light. At this point in time, an arrangement of adjacent openings 41 at the same hole pitch or distance from each other is most suitable, as electrons similarly oscillate in adjacent openings 41 and behave as collective excitation over the entire surface. A staggered arrangement of one opening surrounded by six other openings as shown in FIG. 10 places the openings at a constant hole pitch from each other, thus achieving high chromatic resolving power.

In order for light of R (red: wavelength of 660 nm), G (green: wavelength of 540 nm), and B (blue: wavelength of 440 nm) wavelengths to be transmitted through the plurality of openings 41 periodically formed in the first metal film 31, arrays of holes (arrays of holes 41) at different intervals from each other, respectively, must be formed. In a case where Al, AlCu, or AlSi is used as the material of which the first metal film 31 is made and the array of holes is covered with the insulator film 4 made of $SiO_2$, surface plasmon is excited by vertical incidence of light under conditions where the normalized frequency $a/\lambda=0.65$. According to this equation, the intervals a of the arrays of holes that transmit the respective lights are calculated to be 420 nm (R: red), 340 nm (G: green), and 260 nm (B: blue). According to this equation, the light to be transmitted can be selected by changing the intervals at which the openings 41 are arranged. Therefore, the formation of a pattern of arrangements at different intervals on one photomask makes it possible to simultaneously form an R, G, and B wavelength-selective filter in one photolithographic operation.

In the first embodiment, the outermost openings 41a among the plurality of openings 41 in the first metal film 31 are covered with the second metal film 32. In some cases, several rows of openings 41 including the outermost openings 41 may be covered with the second metal film 32, or only those of the outermost openings 41a which are located in the corners may be covered with the second metal film 32.

Second Embodiment

Figure 6:
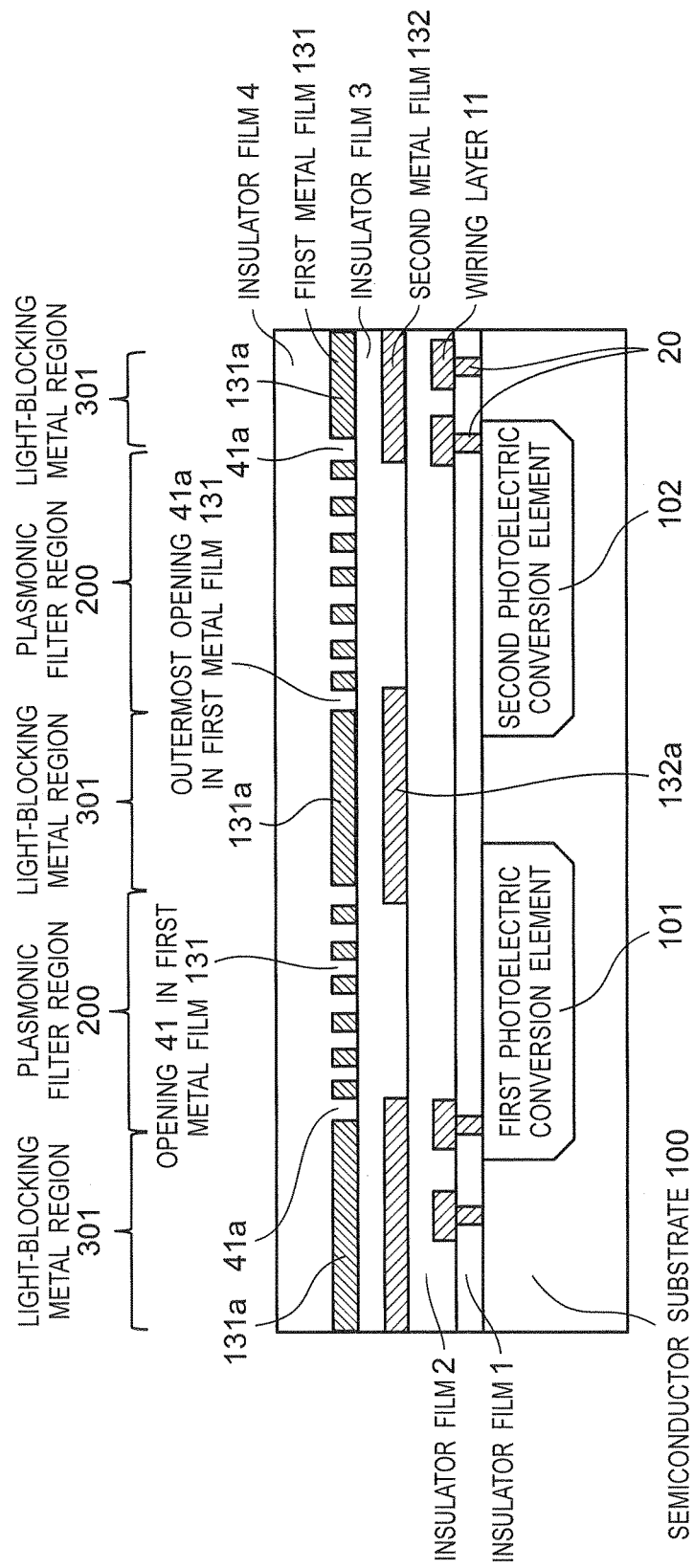
FIG. 6 is a cross-sectional view of a photoelectric conversion device according to a second embodiment of the present invention.

FIG. 6 is a cross-sectional view of a photoelectric conversion device according to a second embodiment of the present invention. Those of the components shown in FIG. 6 which are identical to those of the photoelectric conversion device according to the first embodiment shown in FIG. 1 are given the same reference numerals as the components shown in FIG. 1 and, as such, are not described below. Only those of the components shown in FIG. 6 which are different from the components shown in FIG. 1 are described below.

The photoelectric conversion device according to the second embodiment includes a second photoelectric conversion element 102 in addition to the first photoelectric conversion element 101, and also includes a first metal film 131. The first metal film 131 forms, above the first and second photoelectric conversion elements 101 and 102, plasmonic filter regions 200 having openings 41. Furthermore, the first metal film 131 has light-blocking metal sections 131a that form light-blocking metal regions 301.

The outermost openings 41a among the plurality of openings 41 in the first metal film 131 constituting the plasmonic filter regions 200 are covered with a second metal film 132.

In the photoelectric conversion device thus configured, the outermost openings 41a among the plurality of openings 41 in the first metal film 131 constituting the plasmonic filter regions 200 are covered with the second metal film 132, which is separate from the first metal film 131. This makes it possible to block light transmitted through the outermost openings 41a, which tend to be nonuniform in shapes due to the influence of interfering light from adjacent openings during exposure and the microloading effect during etching. This in turn makes it possible to form a plasmonic filter with the desired wavelength selectivity ensured.

Therefore, the photoelectric conversion device according to the second embodiment makes it possible to prevent anomalous transmission of light of a wavelength that is not supposed to be transmitted and reduce the half-width of a spectral waveform.

Further, the light-blocking metal sections 131a of the first metal film 131, which form the light-blocking metal regions 301, and the second metal film 132, which faces the light-blocking metal sections 131a, cover regions outside of the first and second photoelectric conversion elements 101 and 102. This prevents stray light from entering the first and second photoelectric conversion elements 101 and 102, thus enabling avoidance of aliasing, prevention of malfunction, and improvement in durability.

Next, a method for manufacturing a photoelectric conversion device according to the second embodiment is described with reference to FIG. 6.

As shown in FIG. 6, two or more photoelectric conversion elements (e.g., photodiodes or phototransistors) such as the first and second photoelectric conversion elements 101 and 102 are arranged side by side by introducing N-type impurities into predetermined positions on a semiconductor substrate 100 of a first conductivity type (P type), which is an example of a substrate, and performing heat treatment such as annealing approximately at 1200° C. for 600 minutes. A wiring layer 11 and a second metal film 132 are formed above the two photoelectric conversion elements, i.e., the first and second photoelectric conversion elements 101 and 102, on the semiconductor substrate 100 with insulator films 1 and 2 interposed therebetween, respectively. The second metal film 132 also functions as a wiring layer to constitute a multilayer wire together with the wiring layer 11. The second metal film 132 covers the outermost openings 41a among a plurality of openings 41 in the after-mentioned first metal film 131, and also has a light-blocking metal section 132a that covers a region between the first photoelectric conversion element 101 and the second photoelectric conversion element 102. If the second metal film 132 has no light-blocking metal section 132a and merely covers the outermost openings 41a, there may be a case where light having leaked through the nonuniform openings 41a enters areas on the semiconductor substrate around the first and second photoelectric conversion elements 101 and 102 and leaks not only onto the first and second photoelectric conversion elements 101 and 102 above which the corresponding openings 41a are covered, but also onto adjacent first and second photoelectric conversion elements 101 and 102. For the prevention of such leakage of light onto adjacent first and second photoelectric conversion elements 101 and 102, the region between the first and second photoelectric conversion elements 101 and 102 is covered with the light-blocking metal section 132a. This makes it possible to prevent light having leaked from a photoelectric conversion element from being incident on an adjacent photoelectric conversion element such as oblique incidence) and, at the same time, to prevent light having leaked through the outermost openings 41a, which are nonuniform in hole diameters and shapes, from being incident on adjacent photoelectric conversion elements.

Next, an insulator film 3 is formed so that the first metal film 131, which is to serve as a filter that transmits only particular wavelengths, is formed further above the second metal film 132. After the formation of the insulator film 3, the insulator film 3 is processed by CMP until it becomes completely flat, as the insulator film 3 has a difference in level depending on the presence and absence of the second metal film 132. This surface flattening is important because the first metal film 131 will be formed from an Al or AlCu material on this surface of the insulator film 3 later and the first metal film 131 will be subjected to photolithography with a fine pattern of a wavelength-selective filter for transmitting particular types of light (e.g., R (red), G (green), and B (blue)).

Next, on the insulator film 3 thus flattened, the first metal film 131, which serves as a filter material, is formed by sputtering to have a thickness of 150 nm. For unity of material, it is most desirable that the metal of which the filter material is made be Al; however, the metal may be AlCu or AlSi, which are more commonly used in semiconductor manufacturing. In a case where an infrared-region wavelength-selective film needs to be formed, the metal may be Au or Cu. Further, it is desirable that the first metal film 131 have a film thickness of approximately 50 to 200 nm. Further, it is necessary that the first metal film 131 have a film thickness that enables blocking of light wavelengths for example of 300 nm to 1200 nm, as the light-blocking metal sections 131a will be formed from the same first metal film 131. The first metal film 131 is not formed on a pad section (not illustrated) that is an electrode-extended section.

After the application of the first metal film 131, a photoresist (not illustrated) is applied onto the first metal film 131, and a pattern of openings of the wavelength-selective filter is formed in the photoresist by photolithography. This pattern of openings of the wavelength-selective filter is formed on a part of the first metal film 131 above light-receiving openings above the first and second photoelectric conversion elements 101 and 102, and is also formed so that all of the outermost openings are covered with the second metal film 132. Then, the first metal film 131 is etched with the photoresist as a mask to have a plurality of openings 41 as shown in FIG. 6. The outermost openings 41a among the plurality of openings 41 are covered with the second metal film 132.

Such covering of the outermost openings 41a among the plurality of openings 41 in the first metal film 131 with the second metal film 132 makes it possible to block light transmitted through the outermost openings 41a, which tend to be nonuniform in opening shapes due to the influence of interfering light during exposure and the microloading effect during etching. This makes it possible to prevent an increase in the half-width of the transmitted light and anomalous transmission such as transmission of light of a wavelength that is not supposed to be transmitted.

Further, the light-blocking metal sections 131a of the first metal film 131, which constitute the light-blocking metal regions 301, and the light-blocking metal section 132a of the second metal film 132 are provided between the first photoelectric conversion element 101 and the second photoelectric conversion element 102 and in places corresponding to the outside of the first and second photoelectric conversion elements 101 and 102 so as to prevent stray light from entering the first and second photoelectric conversion elements 101 and 102.

The openings 41 take the form of through-holes or depressions, and the plurality of openings 41 are two-dimensionally and periodically patterned. The formation of the plurality of periodic openings 41 in the first metal film 131 allows the first metal film 131 to function as a wavelength-selective filter, because when light is incident on the first metal film 131, the incorporation of a surface plasmon dispersion relation into the openings 41 two-dimensionally and periodically arranged on the first metal film 131 allows surface plasmon to be excited by the light. At this point in time, an arrangement of adjacent openings 41 at the same hole pitch or distance from each other is most suitable, as electrons similarly oscillate in adjacent openings 41 and behave as collective excitation over the entire surface. A staggered arrangement of one opening surrounded by six other openings as shown in FIG. 10 places the openings at a constant hole pitch from each other, thus achieving high chromatic resolving power.

After the processing of the first metal film 131, an insulator film 4, which is to function as a protective film, is formed from $SiO_2$. In so doing, the insulator film 4 is formed from $SiO_2$ on the first metal film 131 by a high-density plasma CVD method, as the plurality of openings 41 (through-holes or depressions) formed in the first metal film 131 in the preceding step need to be filled with $SiO_2$.

In the second embodiment, the second metal film 132 covers the nonuniformly-formed openings 41a among the plurality of openings 41 in the first metal film 131 above the first photoelectric conversion element 101 and the nonuniformly-formed openings 41a among the plurality of openings 41 in the first metal film 131 above the second photoelectric conversion element 102, and the light-blocking metal sections 131a and 132a cover the region between the first photoelectric conversion element 101 and the second photoelectric conversion element 102. This makes it possible to prevent light transmitted through the nonuniformly-formed openings 41a or stray light from being incident on the first and second photoelectric conversion elements 101 and 102.

Furthermore, the first metal film 131 is formed above the multilayer wire, and the second metal film 132 also serves as the wiring layer 132, which is one of the plurality of wiring layers 11 and 132 of the multilayer wire. This eliminates the need to newly form a single dedicated second metal film 132, thus making it possible to prevent an increase in cost.

Further, the second metal film 132 also serves as the wiring layer 132, which is the uppermost one of the plurality of wiring layers 11 and 132 of the multilayer wire. This reduces the distance between the first metal film 131 and the second metal film 132, thus making it possible to surely block light from leaking to the first or second photoelectric conversion elements 101 or 102.

If the distance between the first metal film 131, which constitutes the plasmonic filter regions, and the second metal film 132 is great, light may partially leak to the first or second photoelectric conversion elements 101 or 102 and thus make spectral sensitivity worse.

Third Embodiment

Figure 7:
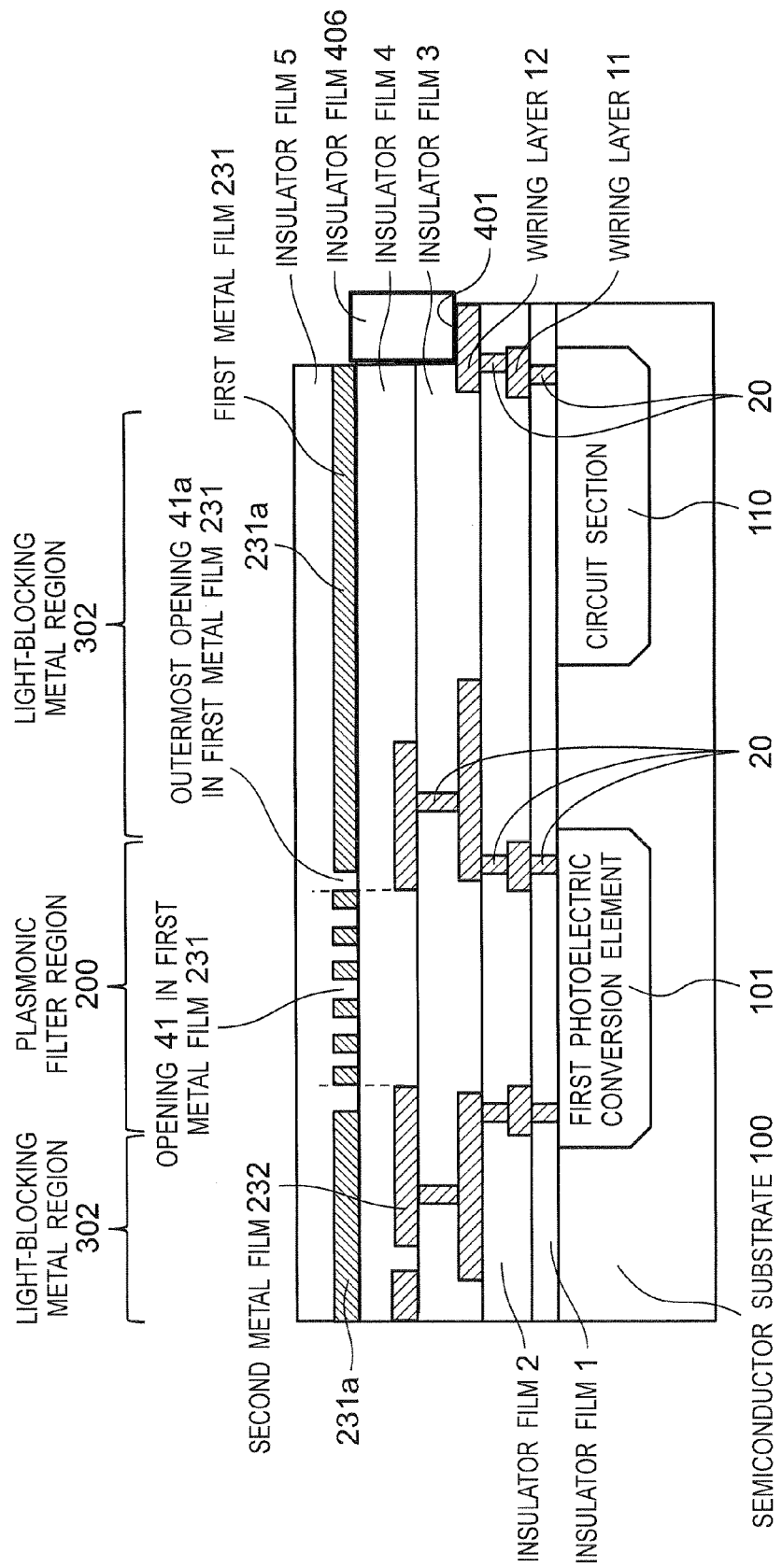
FIG. 7 is a cross-sectional view of a photoelectric conversion device according to a third embodiment of the present invention.

FIG. 7 is a cross-sectional view of a photoelectric conversion device according to a third embodiment of the present invention. Those of the components shown in FIG. 7 which are identical to those of the photoelectric conversion device according to the first embodiment shown in FIG. 1 are given the same reference numerals as the components shown in FIG. 1 and, as such, are not described below. Only those of the components shown in FIG. 7 which are different from the components shown in FIG. 1 are described below.

The photoelectric conversion device according to the third embodiment is a circuit-containing photoelectric conversion device, and has a circuit section 110, as well as the first photoelectric conversion element 101, provided on the semiconductor substrate 100, which is an example of a substrate. Further, the photoelectric conversion device has a first metal film 231. The first metal film 231 forms, above the first photoelectric conversion element 101, a plasmonic filter region 200 having a plurality of openings 41. Furthermore, the first metal film 231 has light-blocking metal regions 231a that form light-blocking metal regions 302.

The outermost openings 41a among the plurality of openings 41 in the first metal film 231 constituting the plasmonic filter region 200 are covered with a second metal film 132, which also functions as the uppermost wiring layer.

In the photoelectric conversion device thus configured, the outermost openings 41a among the plurality of openings 41 in the first metal film 231 constituting the plasmonic filter region 200 are covered with the second metal film 232, which is separate from the first metal film 231. This makes it possible to block light transmitted through the outermost openings 41a, which tend to be nonuniform in shapes due to the influence of interfering light from adjacent openings during exposure and the microloading effect during etching. This in turn makes it possible to form a plasmonic filter with the desired wavelength selectivity ensured.

Therefore, the photoelectric conversion device according to the third embodiment makes it possible to prevent anomalous transmission of light of a wavelength that is not supposed to be transmitted and reduce the half-width of a spectral waveform.

Further, the light-blocking metal sections 231a of the first metal film 231, which form the light-blocking metal regions 302, and the second metal film 232 cover regions outside of the first photoelectric conversion element 101 and the circuit section 110 and a region between the first photoelectric conversion element 101 and the circuit section 110. This prevents stray light from entering the first photoelectric conversion element 101 and the circuit section 110, thus enabling avoidance of aliasing, prevention of malfunction, and improvement in durability.

Further, the first metal layer 231 and, by extension, the light-blocking metal sections 231a are grounded via wires (not illustrated) to be at a ground potential. This allows the first metal layer 231 and the light-blocking metal sections 231a not only to block light, but also to have a shield effect against electrical noise. For example, electrical noise coming into the first metal layer 231 or the light-blocking metal sections 231a can escape into the grounded potential and thus does not adversely affect the circuit section 110 located below the first metal layer 231 and the light-blocking metal sections 231a. That is, the light-blocking metal sections 231a function as shields that both prevent entry of light and protect the circuit section 110 and the like from electrical noise.

Further, the light-blocking metal sections 231a cover ½ or more of the area of the surface of the substrate 100. This makes it possible to reduce the area of the original first metal layer 231 that is etched. This in turn makes it possible to reduce the formation of a deposited material or the like during etching of the original first metal layer 231 with a metal etcher or the like.

Next, a method for manufacturing a photoelectric conversion device according to the third embodiment is described with reference to FIG. 7.

As shown in FIG. 7, a first photoelectric conversion element 101 and a circuit section 101 that processes an electrical signal from the first photoelectric conversion element 101 are formed in predetermined positions on a semiconductor substrate 100, which is an example of a substrate, with photolithography/ion implantation/etching equipment. The circuit section may be a CMOS or a bipolar element. In so doing, besides the circuit section 100, a region is reserved at the same time for the formation of a pad section 401, which serves as a terminal via which an electrical signal is outputted. Wiring layers 11, 12, and 232 are arranged around the first photoelectric conversion element 101 or above the circuit section 110 on the semiconductor substrate 100 with insulator films 1 to 3 interposed therebetween, respectively. The wiring layer 232, which is the second metal film 232, covers the outmost openings 41a among a plurality of openings 41 in a first metal film 231 constituting a plasmonic filter region 200. The second metal film 232 has a function as a wiring layer for ordinary multilayer wiring and a function of covering the outmost openings 41a among the plurality of openings 41 in the first metal film 231.

Next, an insulator film 4 is formed so that the first metal film 231, which is to function as a filter that transmits only particular wavelengths, is formed further above the second metal film 232. After the formation of the insulator film 4, the insulator film 4 has a difference in level depending on the presence and absence of the second metal film 232. This difference in level only takes the form of a protrusion as the insulator film 4 is formed on the second metal film 232 without the formation of a shield metal section in the second metal film 232. Unlike a difference in level in the form of a plane, this difference in level in the form of a protrusion is locally subjected to polishing pressure in a CMP step and thus easily polished. This allows easy flattening and a reduction in the amount of time required for polishing. This reduces the occurrence of dishing, thus achieving a shape that allows easy flattening. In so doing, for the securing of higher flatness, it is desirable to use ceria as slurry. The insulator film 4 is processed by CMP with ceria until it becomes completely flat. This surface flattening is important because the first metal film 231 will be formed later and the first metal film 231 will be subjected to photolithography with a fine pattern of a wavelength-selective filter for transmitting particular types of light (e.g., R, G, and B). This is intended to allow accurate exposure through flattening even if the depth of focus is made shallower by increasing an numerical aperture (NA) of exposure for finer geometries.

Next, on the surface of the insulator film 4 thus flattened, the first metal film 231, which serves as a filter material, is formed by sputtering or with a deposition apparatus to have a thickness of 150 nm. For unity of material, it is most desirable that the metal of which the filer material is made be Al; however, the metal may be AlCu or AlSi, which are more commonly used in semiconductor manufacturing. Further, it is desirable that the first metal film 231 have a film thickness of approximately 50 to 200 nm. Further, it is necessary that the first metal film 231 have a film thickness that enables blocking of light wavelengths of 300 nm to 1200 nm, as the light-blocking metal sections 231a will be formed from the same first metal film 231. No metal film is formed on the pad section 401, which is an electrode-extended section.

Figure 8:
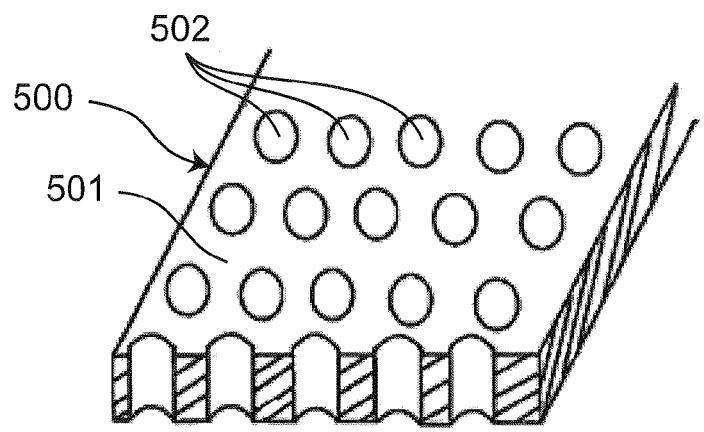
FIG. 8 is a perspective view of a filter layer described in PTL 1 on which an array of holes is patterned.
Figure 9:
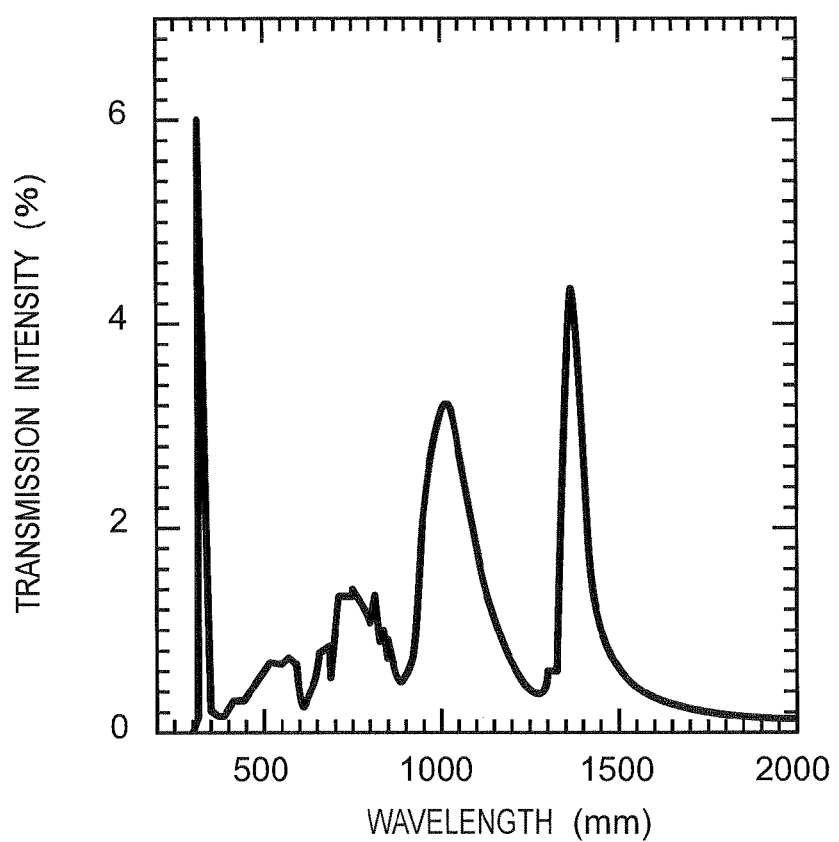
FIG. 9 is a graph showing the waveform of a spectrum transmitted through the filter layer described in PTL 1.

After the application of the first metal film 231, a $SiO_2$ film and an organic BARC (bottom anti-reflective coating) (both not illustrated) are formed on the first metal film 231. The $SiO_2$ film is needed for the lift-off removal of a deposited material that is formed on a filter surface during etching that will be performed later. Further, the BARC is used to facilitate microfabrication by reducing reflection on the surface of metal such as Al. In a normal case of multilayer wiring in a semiconductor process, an anti-reflection layer such as Ti/TiN is formed on a surface of AlCu. However, such a layer cannot be used in this filter, as Al is used to produce plasmon resonance. Therefore, in this instance, such a film as the BARC is formed to reduce surface reflection. After this, a photoresist (not illustrated) is applied, and a pattern of openings of a wavelength-selective filter is formed by photolithography. For B (blue), for example, openings 130 nm in diameter are formed at pitches of 260 nm. For G (green.), for example, openings 170 nm in diameter are formed at pitches of 340 nm. For R (red), for example, openings 210 nm in diameter are formed at pitches of 420 nm. After this, the BARC, the $SiO_2$ film, and the Al film are etched in this order with a metal etcher, and the resist, the BARC, and the $SiO_2$ film are removed, whereby a pattern of a plurality of openings 41 in the first metal film 231, which is to serve as a wavelength-selective filter, is formed. The pattern of the plurality of openings 41 of the wavelength-selective filter is formed on a part of the first metal film 231 above a light-receiving opening above the first photoelectric conversion element 101. The openings 41 are arranged in a two-dimensional and periodic pattern, and take the form of through-holes or depressions. The formation of the periodic openings 41 in the first metal film 231 allows the first metal film 231 to function as a wavelength-selective filter, because when light is incident on the first metal film 231, the incorporation of a surface plasmon dispersion relation into the openings 41 two-dimensionally and periodically arranged on the first metal film 231 allows surface plasmon to be excited by the light. At this point in time, an arrangement of adjacent openings 41 at the same hole pitch or distance from each other is most suitable, as electrons similarly oscillate in adjacent openings 41 and behave as collective excitation over the entire surface. A staggered arrangement of one opening surrounded by six other openings as shown in FIGS. 8 and 10 places the openings at a constant hole pitch from each other, thus achieving high chromatic resolving power.

After the processing of the first metal film 231, as shown in FIG. 7, an insulator film 5, which is to function as a protective film, is formed from $SiO_2$. In so doing, the insulator film 5 is formed from $SiO_2$ by a high-density plasma CVD method, as the plurality of openings (through-holes or depressions) 41 formed in the first metal film 231 in the preceding step need to be filled with $SiO_2$.

Finally, a $SiO_2$ film 406 on the pad section 401 for electrode extension is removed so that the pad section 401 is exposed.

In the third embodiment, the second metal film 232 covers the nonuniformly-formed openings 41a among the plurality of openings 41 in the first metal film 231 above the first photoelectric conversion element 101, and the light-blocking metal sections 231a of the first metal film 231 cover the region between the first photoelectric conversion element 101 and the circuit section 110. This makes it possible to prevent stray light from being incident on the first photoelectric conversion element 101 and the circuit section 110.

Furthermore, the first metal film 231 is formed above the multilayer wire, and the second metal film 232 also serves as the wiring layer 232, which is one of the plurality of wiring layers 11, 12, and 232 of the multilayer wire. This eliminates the need to newly form a single dedicated second metal film 232, thus making it possible to prevent an increase in cost.

Furthermore, the first metal film 231 can be additionally incorporated without a change in the process of the circuit-containing photoelectric conversion device including the circuit section 110. In addition, the second metal film 232 can also serve as the wiring layer 232 of the multilayer wire. This brings about a merit of facilitating process integration.

Further, the second metal film 232 also serves as the wiring layer 232, which is the uppermost one of the plurality of wiring layers 11, 12, and 232 of the multilayer wire. This reduces the distance between the first metal film 231 and the second metal film 232, thus making it possible to surely block light from leaking to the first photoelectric conversion element 101 or the circuit section 110.

If the distance between the first metal film 231, which constitutes the plasmonic filter region, and the second metal film 232 is great, light may partially leak to the first photoelectric conversion element 101 or the circuit section 110 and thus make spectral sensitivity worse.

Fourth Embodiment

Figure 18:
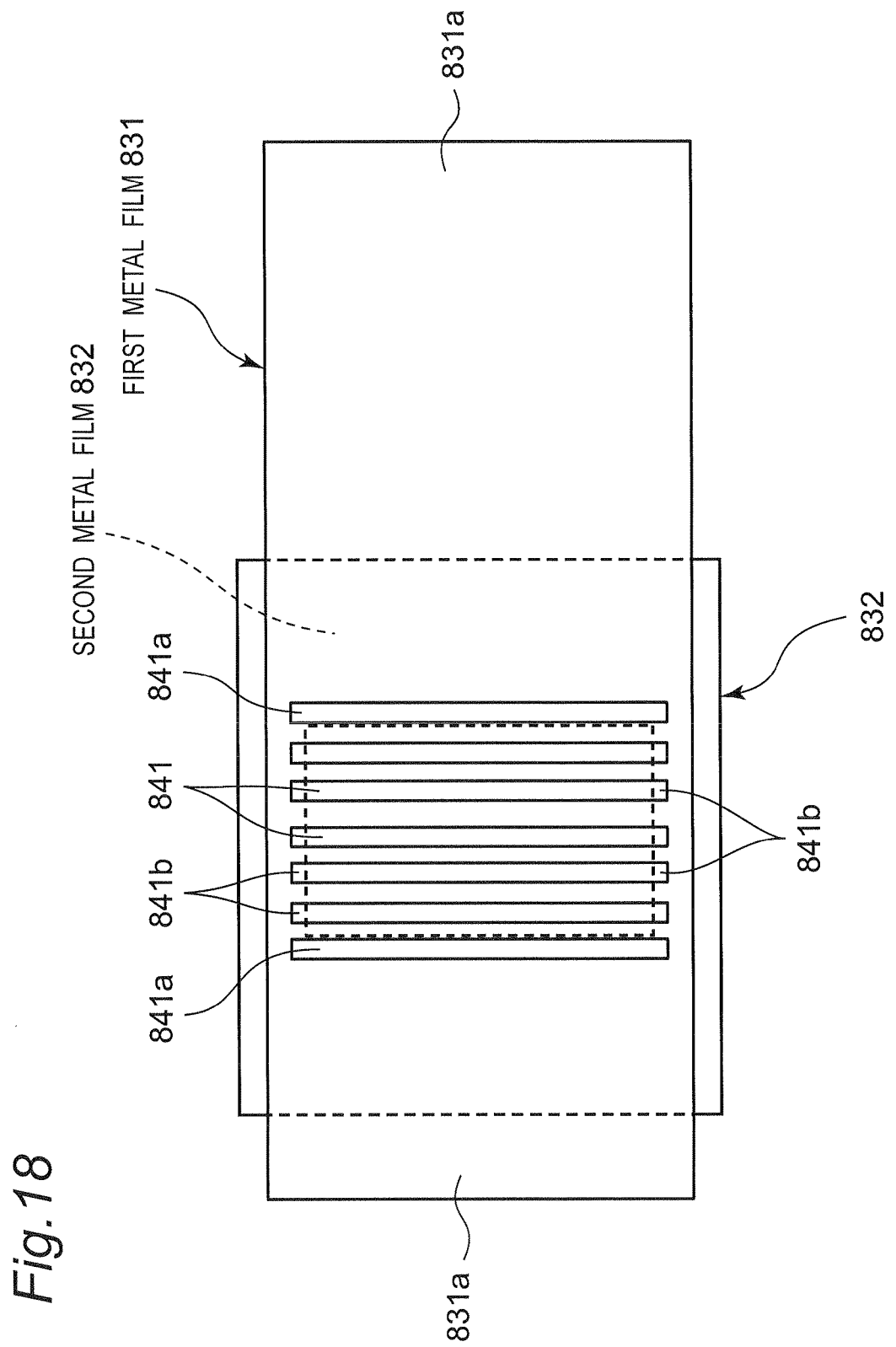
FIG. 18 is a plan view of a photoelectric conversion device according to a fourth embodiment of the present invention.
Figure 19:
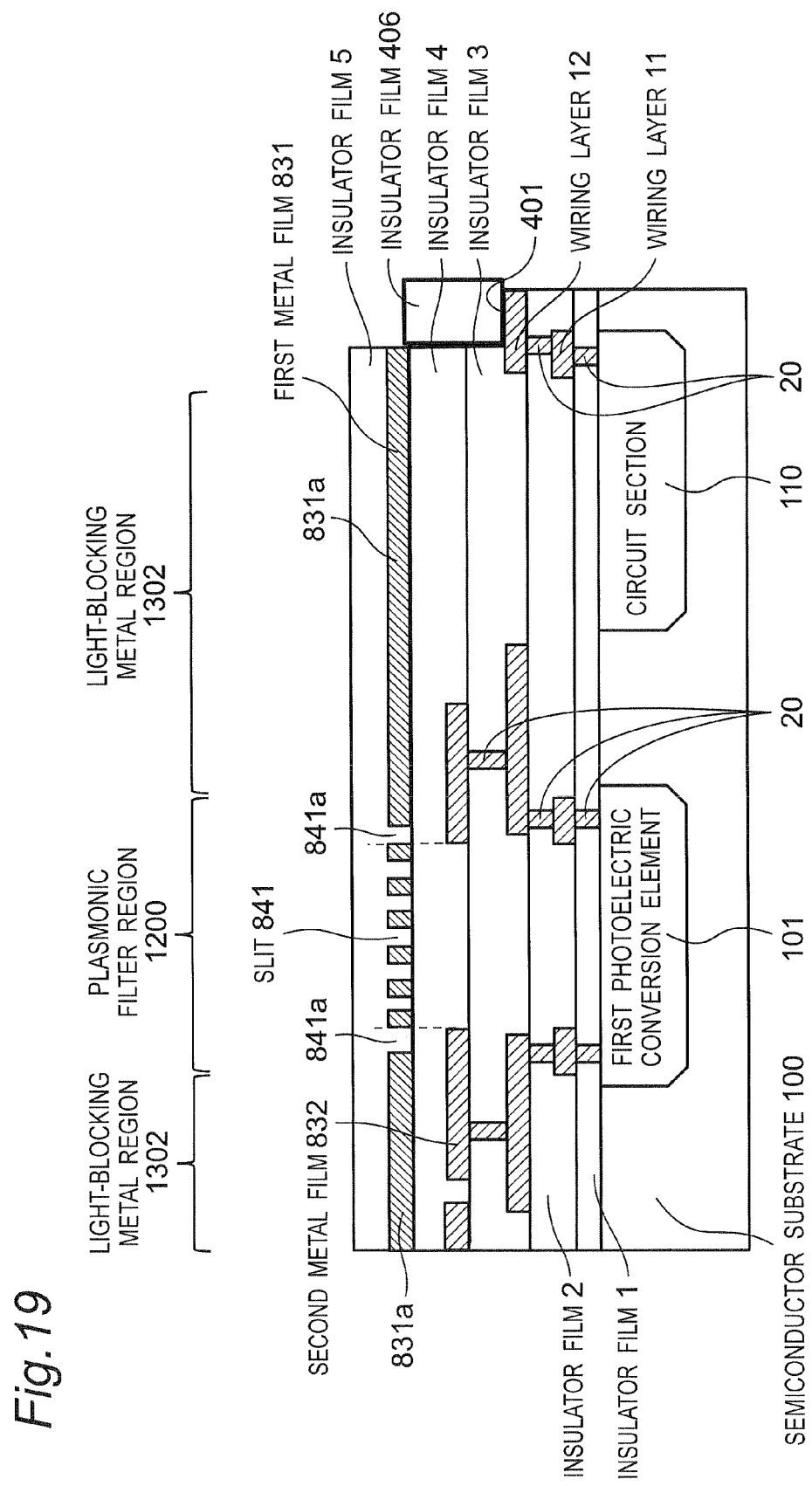
FIG. 19 is a cross-sectional view of the photoelectric conversion device according to the fourth embodiment of the present invention.

FIGS. 18 and 19 are a plan view and a cross-sectional view, respectively, of a photoelectric conversion device according to a fourth embodiment of the present invention. Those of the components shown in FIG. 19 which are identical to those of the photoelectric conversion device according to the third embodiment shown in FIG. 7 are given the same reference numerals as the components shown in FIG. 7 and, as such, are not described below. Only those of the components shown in FIG. 19 which are different from the components shown in FIG. 7 are described below.

As shown in the plan view of FIG. 18, the photoelectric conversion device according to the fourth embodiment includes a first metal film 831 provided with a plurality of slits 841, which are examples of a plurality of openings. The plurality of slits 841 are placed at regular intervals in a transverse direction. The photoelectric conversion device also includes a second metal film 832. As shown in FIGS. 18 and 19, the second metal film 832 covers the whole area of those slits 841a among the plurality of slits 841 which are located at both ends and both end portions 841b of each of the plurality of slits 841 in a longitudinal direction excluding those located at both ends. That is, the second metal film 832 covers the outermost part of the plurality of slits 841.

The first metal film 831 uses the plurality of slits 841 to form a plasmonic filter region 1200 located above the first photoelectric conversion element 101, and has light-blocking metal sections 831a that form light-blocking metal regions 1302.

Further, the first metal film 831 is grounded by a wire (not illustrated) so that a part of the first metal film 831 constituting the plasmonic filter region 1200 and the light-blocking metal sections 831 are at a ground potential.

In the fourth embodiment, the part of the metal film 831 corresponding to the plasmonic filter region 1200 and the light-blocking metal sections 831 are electrically connected to each other. Alternatively, the part of the metal film 831 corresponding to the plasmonic filter region 1200 and the light-blocking metal sections 831 may be electrically disconnected from each other. In this case, for a better wavelength-selective function of a plasmonic filter, it is important that the part of the metal film 831 corresponding to the plasmonic filter region 1200 be grounded to be at a ground potential.

In the photoelectric conversion device thus configured, the whole area of those slits 841a among the plurality of slits 841 which are located at both ends and both end portions 841b of each of the plurality of slits 841 in a longitudinal direction excluding those located at both ends are covered with the second metal film 832, the plurality of slits 841 serving as a plurality of openings in the first metal film 831 constituting the plasmonic filter region 1200. This enables the second metal film 832 to block light transmitted through the slits 841a located at both ends and both end portions 841b of each of the plurality of slits 841 in a longitudinal direction, although the slits 841a and the end portions 841b tend to be nonuniform in shapes due to the influence of interfering light from adjacent openings during exposure and the microloading effect during etching. Thus, a slit structure, too, can form a plasmonic filter with the desired wavelength selectivity ensured.

Therefore, the photoelectric conversion device according to the fourth embodiment makes it possible prevent anomalous transmission of light of a wavelength that is not supposed to be transmitted and reduce the half-width of a spectral waveform.

Further, the second metal film 832 covers a region outside of the first photoelectric conversion element 101. This prevents stray light from entering the first photoelectric conversion element 101, thus enabling avoidance of aliasing, prevention of malfunction, and improvement in durability.

Further, the first metal layer 831 is grounded to be at a ground potential. This stabilizes the potential of the part of the first metal film 831 constituting the plasmonic filter region 1200, thus stabilizing the behavior of electrons to bring about good wavelength selectivity. A change in the potential of the part of the first metal film 831 constituting the plasmonic filter region 1200, if any, adversely affects the wavelength selectivity.

Further, the light-blocking metal sections 831a of the first metal film 831 are grounded to be at a ground potential. Therefore, the light-blocking metal sections 831a not only function as light shields that prevent entry of light into the first photoelectric conversion element 101 by blocking the light, but also function as electric shields that protect the circuit section 110 and the like from electrical noise.

Further, the light-blocking metal sections 831a cover ½ or more of the area of the surface of the substrate 100. This makes it possible to reduce the area of the original first metal layer 831 that is etched. This in turn makes it possible to reduce the formation of a deposited material or the like during etching of the original first metal layer 831 with a metal etcher or the like.

Next, a method for manufacturing a photoelectric conversion device according to the fourth embodiment is described with reference to FIGS. 18 and 19.

As shown in FIG. 19, a first photoelectric conversion element 101 and a circuit section 101 that processes an electrical signal from the first photoelectric conversion element 101 are formed in predetermined positions on a semiconductor substrate 100, which is an example of a substrate, with photolithography/ion implantation/etching equipment. The circuit section 110 may be a CMOS or a bipolar element. In so doing, besides the circuit section 100, a region is reserved at the same time for the formation of a pad section 401, which serves as a terminal via which an electrical signal is outputted.

Wiring layers 11, 12, and 832 are arranged around the first photoelectric conversion element 101 or above the circuit section 110 on the semiconductor substrate 100 with insulator films 1 to 3 interposed therebetween, respectively. The wiring layer 832, which is the second metal film 832, covers those slits 841*a* among a plurality of slits 841 which are located at the outermost ends in a transverse direction, the plurality of slits 841 serving as a plurality of opening in the first metal film 831 constituting the plasmonic filter region 1200, and both end portions 841*b* of each of the plurality of slits 841 excluding those located at both ends in a transverse direction as shown in FIG. 18. The second metal film 832 has a function as a wiring layer for ordinary multilayer wiring and a function of covering the outmost part of the plurality of slits 841 in the first metal film 831 (i.e., those slits 841*a* among the plurality of slits 841 which are located at the outermost ends in a transverse direction and both end portions 841*b* of each of the plurality of slits 841 excluding those located at both ends in a transverse direction).

Next, an insulator film 4 is formed so that the first metal film 831, which is to function as a filter that transmits only particular wavelengths, is formed further above the second metal film 832. After the formation of the insulator film 4, the insulator film 4 has a difference in level depending on the presence and absence of the second metal film 832. This difference in level only takes the form of a protrusion as the insulator film 4 is formed on the wiring layer (second metal film) 832 without the formation of a shield metal section in the wiring layer 11, 12, or 832. Unlike a difference in level in the form of a plane, this difference in level in the form of a protrusion is locally subjected to polishing pressure in a CMP step and thus easily polished. This allows easy flattening and a reduction in the amount of time required for polishing. This reduces the occurrence of dishing, thus achieving a shape that allows easy flattening. In so doing, for the securing of higher flatness, it is desirable to use ceria as slurry. The insulator film 4 is processed by CMP with ceria until it becomes completely flat. This surface flattening is important because the first metal film 831 will be formed later and the first metal film 831 will be subjected to photolithography with a fine pattern of a wavelength-selective filter for transmitting particular types of light (e.g., R, G, and B). This is intended to allow accurate exposure through flattening even if the depth of focus is made shallower by increasing an numerical aperture (NA) of exposure for finer geometries.

Next, on the surface of the insulator film 4 thus flattened, the first metal film 831, which serves as a filter material, is formed by sputtering or with a deposition apparatus to have a thickness of 150 nm. For unity of material, it is most desirable that the metal of which the filer material is made be Al; however, the metal may be AlCu or AlSi, which are more commonly used in semiconductor manufacturing. Further, it is desirable that the first metal film 831 have a film thickness of approximately 50 to 200 nm. Further, it is necessary that the first metal film 831 have a film thickness that enables blocking of light wavelengths of 300 nm to 1200 nm, as the light-blocking metal sections 831*a* will be formed from the same first metal film 831. No metal film is formed on the pad section 401, which is an electrode-extended section.

After the application of the first metal film 831, a $SiO_2$ film and an organic BARC (bottom anti-reflective coating) (both not illustrated) are formed on the first metal film 831. The $SiO_2$ film is needed for the lift-off removal of a deposited material that is formed on a filter surface during etching that will be performed later. Further, the BARC is used to facilitate microfabrication by reducing reflection on the surface of metal such as Al. In a normal case of multilayer wiring in a semiconductor process, an anti-reflection layer such as Ti/TiN is formed on a surface of AlCu. However, such a layer cannot be used in this filter, as Al is used to produce plasmon resonance. Therefore, in this instance, such a film as the BARC is formed to reduce surface reflection. After this, a photoresist (not illustrated) is applied, and a pattern of openings of a wavelength-selective filter is formed by photolithography to take on a slit structure. For B (blue), for example, openings 130 nm in diameter are formed at pitches of 260 nm to take on a slit structure. For G (green), for example, openings 170 nm in diameter are formed at pitches of 340 nm to take on a slit structure. For R (red), for example, openings 210 nm in diameter are formed at pitches of 420 nm to take on a slit structure. After this, the BARC, the $SiO_2$ film, and the Al film are etched in this order with a metal etcher, and the resist, the BARC, and the $SiO_2$ film are removed, whereby a pattern of a plurality of openings (slits) 841 of a slit structure of the first metal film 831, which is to serve as a wavelength-selective filter, is formed. The pattern of the plurality of openings 841 of the wavelength-selective filter is formed on a part of the first metal film 831 above a light-receiving opening above the first photoelectric conversion element 101. The openings 841 are arranged in a pattern that takes on a slit structure in which the slits 841 are periodically arranged in a transverse direction, and the slits 841 take the form of long narrow through-holes or depressions. The formation of the periodic slits 841 in the first metal film 831 allows the first metal film 831 to function as a wavelength-selective filter, because when light is incident on the first metal film 831, the incorporation of a surface plasmon dispersion relation into the openings 841 periodically arranged in a slit structure on the first metal film 831 allows surface plasmon to be excited by the light. At this point in time, an arrangement of adjacent slits 841 at the same slit pitch or distance from each other is most suitable, as electrons similarly oscillate in adjacent slits 841 and behave as collective excitation over the entire surface. As shown in the plan view of FIG. 18, the outermost slits (i.e., those slits 841*a* among the plurality of slits 841 which are located at the outermost ends in a transverse direction and both end portions 841*b* of each of the plurality of slits 841), which are not good in processing accuracy, are subjected to light blocking by the second metal film 832 and thus do not contribute as a plasmonic filter. This places the slits at a constant slit pitch from each other, thus achieving high chromatic resolving power.

After the processing of the first metal film 831, as shown in FIG. 19, an insulator film 5, which is to function as a protective film, is formed from $SiO_2$. In so doing, the insulator film 5 is formed from $SiO_2$ by a high-density plasma CVD method, as the plurality of openings (through-holes or depressions) 841 formed in the first metal film 831 in the preceding step need to be filled with $SiO_2$.

Finally, a $SiO_2$ film 406 on the pad section 401 for electrode extension is removed so that the pad section 401 is exposed.

In each of the first to fourth embodiments, the second metal film 32, 132, 232, or 832, which covers the outermost openings 41*a* or 841*a* among the plurality of openings 41 or 841 in the first metal film 31, 131, 231, or 831 and/or the end portions 841*b* of each of the openings 841, is provided between the first metal film 31, 131, 231, or 831 constituting the plasmonic filter region(s) 200 or 1200 and the substrate 100. Alternatively, a second metal film that covers the outermost openings man be provided above a first metal film constituting a plasmonic filter region(s). That is, a first metal film constituting a plasmonic filter region(s) may be provided between a second metal film and a substrate.

The present invention and the embodiments are summarized as follows:

A photoelectric conversion device of the present invention includes:

a first photoelectric element 101 provided on a substrate 100;

a first metal film 31, 131, 231, 831 for constituting a plasmonic filter region, the first metal film 31, 131, 231, 831 being provided above the first photoelectric conversion element 101 with insulator films 1, 2, 3 interposed therebetween and having a plurality of openings 41, 841 arranged periodically or aperiodically; and a second metal film 32, 132, 232, 832 covering a part of the plurality of openings 41, 841 in the first metal film 31, 131, 231, 831.

According to this configuration, that part of the openings 41, 841 in the first metal film 31, 131, 231, 831 which is expected to be nonuniformly formed is covered with the second metal film 32, 132, 232, 832, and light transmitted through the nonuniform part of the openings 41, 841 in the first metal film 31, 131, 231, 831 can be blocked by the second metal film 32, 132, 232, 832 from reaching the first photoelectric conversion element 101. Therefore, anomalous transmission of light of a wavelength that is not supposed to be transmitted can be prevented, and transmitted light disturbed by the nonuniform part of the openings 41, 841 does not contribute as a photoelectric current, so that an increase in half-width can be prevented.

It should be noted that the part of the openings 41, 841 in the first metal film 31, 131, 231 is not limited to the outermost openings 41a, 841a, 841b among the plurality of openings 41, 841 in the first metal film 31, 131, 231, but may include those located closer to the inside than the outermost openings 41a, 841a, e.g., the second outermost openings 41, 841.

In one embodiment, the second metal film 32, 132, 232, 832 covers at least the outermost openings 41a, 841a, 841b among the plurality of openings 41, 841 in the first metal film 31, 131, 231, 831.

The outermost openings 41a, 841a, 841b among the plurality of openings 41, 841 in the first metal film 31, 131, 231, 831 are not surrounded by other openings 41, 841. Thus, the outermost openings 41a, 841a, 841b are distinctive in comparison with the middle openings 41, 841 surrounded by other openings 41, 841 and tend to be nonuniform due to exposure and etching.

Therefore, as in this embodiment, by covering at least the outermost openings 41a, 841a, 841b among the openings 41, 841 in the first metal film 31, 131, 231, 831, light transmitted through these distinctive openings 41a, 841a, 841b can be blocked by the second metal film 32, 132, 232, 832. Thus, transmitted light disturbed by the nonuniform openings 41a, 841a, 841b does not contribute as a photoelectric current, so that an increase in half-width can be prevented.

As shown in FIGS. 11 and 12, the outermost openings 41 among the plurality of openings 41 in the first meal film 31, 131, 231 have distinctive sizes, and in particular, the openings 41a in the corners have distinctive sizes. Thus, it is preferable that the openings 41a in the corners among the outermost openings 41a be covered with the second metal film 32, 132, and 232.

In one embodiment, the photoelectric conversion device further includes a second photoelectric conversion element 102 provided on the substrate 100, the first metal film 131 is provided above the first and second photoelectric conversion elements 101, 102 with the insulator films 1, 2, 3 interposed therebetween, and the second metal film 132 covers a part of the plurality of openings 41 in the first metal film 131 above the first photoelectric conversion element 101 and a part of the plurality of openings 41 in the first metal film 131 above the second photoelectric conversion element 102 and covers a region between the first photoelectric conversion element 101 and the second photoelectric conversion element 102.

According to this embodiment, the nonuniformly-formed openings 41a among the plurality of openings 41 in the first metal film 131 are covered with the second metal film 132, and light transmitted through those openings 41a can be blocked by the second metal film 132 to be prevented from being incident on the first and second photoelectric conversion elements 101 and 102. Moreover, since the second metal film 132 covers the region between the first photoelectric conversion element 101 and the second photoelectric conversion element 102, the second metal film 132 can also function as a light-blocking metal that blocks stray light.

In one embodiment, the photoelectric conversion device further includes: a circuit section 110 provided on the substrate 100; and a multilayer wire composed of a plurality of wiring layers 11, 12, 232, 832 formed with the insulator films 1, 2, 3 interposed therebetween, respectively, the first metal film 231, 831 is provided above the multilayer wire, and the second metal film 232, 832 also serves as one wiring layer 232, 832 of the plurality of wiring layers 11, 12, 232, 832 of the multilayer wire.

According to this embodiment, the second metal film 232, 832 also serves as the wiring layer 232, 832, which is one the plurality of wiring layers 11, 12, 232, 832 of the multilayer wire. This eliminates the need to newly form a single dedicated second metal film 232, 832, thus making it possible to prevent an increase in cost. Furthermore, the first metal film 231 can be additionally incorporated without a change in the process of the circuit-containing photoelectric conversion device including the circuit section 110. In addition, the second metal film 232, 832 can also serve as the wiring layer 232, 832 of the multilayer wire. This brings about a merit of facilitating process integration.

In one embodiment, the second metal film 132, 232, 832 also serves as the uppermost wiring layer 132, 232, 832 among the plurality of the wiring layers 11, 12, 132, 232 of the multilayer wire.

Further, the second metal film 132, 232, 832 also serves as the wiring layer 132, 232, 832, which is the uppermost one of the plurality of wiring layers 11, 12, 132, 232, 832 of the multilayer wire. This reduces the distance between the first metal film 131, 231, 831 and the second metal film 132, 232, 832, thus making it possible to surely block light from leaking to the first or second photoelectric conversion element 101, 102 or the circuit section 110.

If the distance between the first metal film 131, 231, 831, which constitutes the plasmonic filter region, and the second metal film 132, 232, 832 is great, light may partially leak to the first or second photoelectric conversion element 101, 102 or the circuit section 110 and thus make spectral sensitivity worse or cause a malfunction.

In one embodiment, the first and second metal films 31, 131, 231, 831, 32, 132, 232, 832 are made of Al or AlCu.

Figure 16:
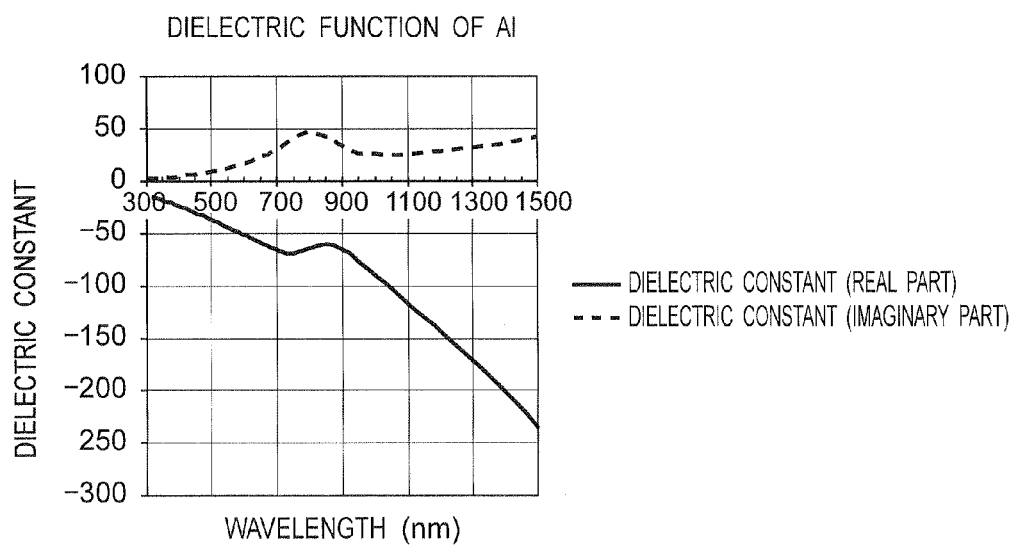
FIG. 16 is a graph showing a dielectric function of Al.
Figure 17:
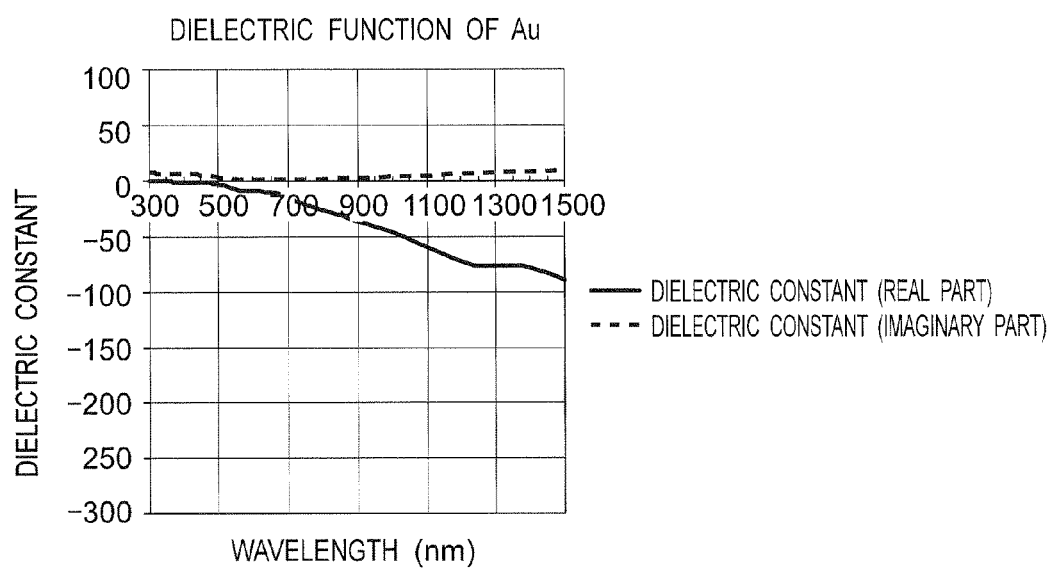
FIG. 17 is a graph showing a dielectric function of Au.

FIG. 16 shows a dielectric function of Al. In general, in terms of the property of easily producing plasmon resonance, it is desirable that the real part of a dielectric function be small and the imaginary part be large. In such an application as this concerned about three primary colors of light, metal Al or AlCu, which satisfies the foregoing conditions in a wavelength region of 300 to 700 nm as Al does, is desirable. On the other hand, in a case where a long-wavelength transmission filter is formed using a plasmon resonance phenomenon, a material that satisfies the foregoing conditions at a wavelength of 700 nm or longer as Au does in FIG. 17 is desirable.

In one embodiment, the second metal film 32, 132, 232, 832 has a thickness that prevents at least transmission of light.

In one embodiment, the second metal film 32, 132, 232, 832 prevents transmission of light of wavelengths of 300 nm or longer to 1200 nm or shorter.

In one embodiment, the first metal film 31, 131, 231, 831 transmits three primary colors of light.

In one embodiment, the plurality of openings 841 in the first metal film 831 are slits 841.

According to this embodiment, a slit structure can give a filter having wavelength selectivity, using a plasmon resonance phenomenon.

In one embodiment, at least a part of the first metal film 831 constituting the plasmonic filter region 1200 is grounded.

Further, at least a part of the first metal film 831 constituting the plasmonic filter region 1200 is grounded to be at a ground potential. This stabilizes the potential of the part of the first metal film 831 constituting the plasmonic filter region 1200, thus stabilizing the behavior of electrons to bring about good wavelength selectivity.

A method of the present invention for manufacturing a photoelectric conversion device includes:

forming a photoelectric conversion element 101, 102 on a substrate 100;

forming a plurality of wiring layers 11, 12, 132, 232, 832 in sequence above the substrate 100 with insulator films 1, 2, 3 interposed therebetween, respectively, so that the uppermost wiring layer 132, 232, 832 among the plurality of wiring layers 11, 12, 132, 232, 832 also serves as a second metal film 132, 232, 832; and forming a first metal film 131, 231, 831 above the first photoelectric conversion element 101 with insulator films 1, 2, 3, 4 interposed therebetween, the first metal film 31, 131, 231, 831 being for constituting a plasmonic filter region and having a plurality of openings 41, 841 arranged periodically or aperiodically, so that a part of the plurality of openings 41, 841 in the first metal film 131, 231, 831 is covered with the second metal film 132, 232, 832.

The present invention makes it possible to manufacture a photoelectric conversion device capable of preventing anomalous transmission of light of a wavelength that is not supposed to be transmitted and reducing the half-width of a spectral waveform.

The components described in the first to fourth embodiments and the modifications may of course be combined as appropriate and selected, substituted, or deleted as appropriate.

REFERENCE SIGNS LIST 1, 2, 3, 4, 5 Insulator film
11, 12, 132, 232, 832 Wiring layer
31, 131, 231, 831 First metal film
32, 132, 232, 832 Second metal film
100 Semiconductor substrate
101 First photoelectric conversion element
102 Second photoelectric conversion element
110 Circuit section
131a, 132a, 831a Light-blocking metal section
200, 1200 Plasmonic filter region
301, 302, 1302 Light-blocking metal region

The invention claimed is:

1. A photoelectric conversion device comprising:
a first photoelectric element provided on a substrate;
a first metal film for constituting a plasmonic filter region, the first metal film being provided above the first photoelectric conversion element with insulator films interposed therebetween and having a plurality of openings arranged periodically or aperiodically; and
a second metal film covering a part of the plurality of openings in the first metal film,
wherein the second metal film is configured to cover all of the outermost openings positioned in a peripheral part of the plasmonic region among the plurality of openings in the first metal film and to block light transmitted through all of the outermost openings; and
the first and second metal films are spaced apart.

2. The photoelectric conversion device according to claim 1, further comprising a second photoelectric conversion element provided on the substrate,
wherein the first metal film is provided above the first and second photoelectric conversion elements with the insulator films interposed therebetween, and
the second metal film covers a part of the plurality of openings in the first metal film above the first photoelectric conversion element and a part of the plurality of openings in the first metal film above the second photoelectric conversion element and covers a region between the first photoelectric conversion element and the second photoelectric conversion element.

3. The photoelectric conversion device according to claim 1, wherein the plurality of openings in the first metal film are slits.

4. The photoelectric conversion device according to claim 1, wherein at least a part of the first metal film constituting the plasmonic filter region is grounded.

5. A photoelectric conversion device comprising:
a first photoelectric element provided on a substrate;
a first metal film constituting a plasmonic region, the first metal film being provided above the first photoelectric conversion element with insulator films interposed therebetween and having a plurality of openings arranged periodically or aperiodically; and
a second metal film covering a part of the plurality of openings n the first metal film,
wherein the second metal film is configured to cover at least all of outermost openings among the plurality of openings in the first metal film and to block light transmitted through all of the outermost openings;
a circuit section provided on the substrate; and
a multilayer wire composed of a plurality of wiring layers formed with the insulator films interposed therebetween, respectively,
wherein the first metal film is provided above the multilayer wire, and
the second metal film also serves as one wiring layer of the plurality of wiring layers of the multilayer wire.

6. A method for manufacturing a photoelectric conversion device, comprising:
forming a photoelectric conversion element on a substrate;
forming a plurality of wiring layers in sequence above the substrate with insulator films interposed therebetween, respectively, so that the uppermost wiring layer among the plurality of wiring layers also serves as a second metal film; and forming a first metal film above the first photoelectric conversion element with insulator films interposed therebetween, the first metal film being for constituting a plasmonic filter region and having a plurality of openings arranged periodically or aperiodically, and covering at least all of the outermost openings among the plurality of openings in the first metal film with the second metal film.

\* \* \* \* \*